US007223504B2

(12) United States Patent
Lee et al.

(10) Patent No.: US 7,223,504 B2
(45) Date of Patent: May 29, 2007

(54) CRYSTALLIZATION MASK, CRYSTALLIZATION METHOD, AND METHOD OF MANUFACTURING THIN FILM TRANSISTOR INCLUDING CRYSTALLIZED SEMICONDUCTOR

(75) Inventors: Su-Gyeong Lee, Seoul (KR); Hyun-Jae Kim, Seongnam-si (KR); Myung-Koo Kang, Seoul (KR)

(73) Assignee: Samsung Electronics Co., Ltd, Suwon-si, Gyeonggi-do (KR)

( * ) Notice: Subject to any disclaimer, the term of this patent is extended or adjusted under 35 U.S.C. 154(b) by 47 days.

(21) Appl. No.: 10/993,648

(22) Filed: Nov. 19, 2004

(65) Prior Publication Data

US 2005/0151146 A1 Jul. 14, 2005

(30) Foreign Application Priority Data

Nov. 19, 2003 (KR) .................. 10-2003-0082222

(51) Int. Cl.
*G03F 1/00* (2006.01)

(52) U.S. Cl. ......................................................... 430/5

(58) Field of Classification Search .................... 430/5, 430/394; 372/103; 438/149, 150; 117/200, 117/201, 202
See application file for complete search history.

(56) References Cited

U.S. PATENT DOCUMENTS 6,959,029 B2 * 10/2005 Voutsas et al. ............. 372/103
7,011,911 B2 * 3/2006 Kim et al. ...................... 430/5
7,018,750 B2 * 3/2006 Hwang ........................... 430/5

* cited by examiner

*Primary Examiner*—S. Rosasco
(74) *Attorney, Agent, or Firm*—MacPherson Kwok Chen & Heid LLP

(57) ABSTRACT

A crystallization mask for laser illumination for converting amorphous silicon into polysilicon is provided, which includes: a plurality of transmissive areas having a plurality of first slits for adjusting energy of the laser illumination passing through the mask; and an opaque area.

5 Claims, 32 Drawing Sheets

CRYSTALLIZATION MASK, CRYSTALLIZATION METHOD, AND METHOD OF MANUFACTURING THIN FILM TRANSISTOR INCLUDING CRYSTALLIZED SEMICONDUCTOR

BACKGROUND OF THE INVENTION (a) Field of the Invention

The present invention relates to a crystallization mask, a crystallization method, and a method of manufacturing a thin film transistor including crystallized semiconductor.

(b) Description of Related Art

A thin film transistor array panel is used for a display device such as a liquid crystal display (LCD) or an organic light emitting display (OLED), which includes a plurality of pixels independently driven by thin film transistors (TFTs).

In general, an LCD includes two panels having field generating electrodes and a liquid crystal layer interposed therebetween. This LCD displays desired images by applying electric field using the electrodes to the liquid crystal layer with dielectric anisotropy and adjusting the strength of the electric field to control the amount of light passing through the panels. In this case, TFTs are used for controlling signals transmitted to the electrodes.

An OLED is a self emissive display device, which displays images by exciting an emissive organic material to emit light. The OLED includes an anode (hole injection electrode), a cathode (electron injection electrode), and an organic light emission layer interposed therebetween. When the holes and the electrons are injected into the light emission layer, they are recombined and pair annihilated with emitting light. The light emission layer further includes an electron transport layer (ETL) and a hole transport layer (HTL) as well as an electron injecting layer (EIL) and a hole injecting layer (HIL) for enhancing the light emission. Each pixel of the OLED includes two TFTs, i.e., a switching TFT and a driving TFT. The current for light emission is driven by the driving TFT and the mount of the current driven the driving TFT is controlled by the data signals from the switching TFT.

The most commonly used TFTs for an LCD adapts amorphous silicon as a semiconductor layer.

An amorphous silicon TFT has mobility of about 0.5 to 1 $cm^2/Vsec$, which is suitable for a switching element of an LCD. However, it is not sufficient for a driving circuit of a display device.

In order to overcome such a problem, an organic EL or a polysilicon TFT LCD using a polysilicon with electron mobility of 20 to 150 $cm^2/Vsec$ as a semiconductor layer has been developed. The relatively high electron mobility polysilicon TFT enables to implement a chip in glass technique that a display panel embeds its driving circuits.

In recent years, one of the most widely used methods of forming a polysilicon thin film on a glass substrate with a low melting point is an eximner laser annealing technique. The technique irradiates light with the wavelength, which can be absorbed by amorphous silicon, from an eximer laser into an amorphous silicon layer deposited on a substrate to melt the amorphous silicon layer at 1,400° C., thereby crystallizing the amorphous silicon into polysilicon. The crystal grain has a relatively uniform size ranging about 3,000–5,000, and the crystallization rime is only about 30–200 nanoseconds, which does not damage the glass substrate. However, there are disadvantages that non-uniform grain boundaries decrease the uniformity for electrical characteristics between the TFTs and make it hard to adjust the microstructure of the grams.

To solve these problems, a sequential lateral solidification process capable of adjusting the distribution of the grain boundaries has been developed. The process is based on the fact that the grains of polysilicon at the boundary between a liquid phase region exposed to laser beam and a solid phase region not exposed to laser beam grow in a direction perpendicular to the boundary surface. A mask having a slit pattern is provided, and a laser beam passes through transmittance areas of the mask to completely melt amorphous silicon, thereby producing liquid phase regions arranged in a slit pattern. Thereafter, the melted amorphous silicon cools down to be crystallized, and the crystal growth starts from the boundaries of the solid phase regions not exposed to the laser beam, and proceeds in the directions perpendicular to the boundary surface. The grains stop growing when they encounter each other at the center of the liquid phase region. This process is repeated after moving the slit pattern of the mask in the direction of the grain growth, and thus the sequential lateral solidification covers the whole area. The sizes of the grains can be as much as the widths of the slit pattern.

After the sequential lateral solidification, protrusions of protuberances of about 400–1,000 Å are formed on the surface of the polysilicon layer along the grain boundaries. These causes stress on the boundary surface of a gate insulating layer to be formed on the semiconductor layer. The stress in this process is found to be ten times more than that in the eximer laser annealing, and this results in degrading the characteristics of the TFTs.

SUMMARY OF THE INVENTION

A motivation of the present invention is to solve the problems of conventional techniques.

A crystallization mask for laser illumination for converting amorphous silicon into polysilicon is provided, which includes: a plurality of transmissive areas having a plurality of first slits for adjusting energy of the laser illumination passing through the mask; and an opaque area.

The transmissive areas may further have a plurality of second slits having width different from the first slits and substantially fully transmitting the laser illumination.

The first slits may include translucent films and the second slits are openings.

The width of the first slits may be smaller than the width of the second slits.

The second slits may be arranged to form a plurality of slit columns and the second slits in adjacent slit columns may be offset by a half of a pitch between the second slits.

A crystallization method is provided, which includes: depositing an thin film of amorphous silicon on a substrate; illuminating a first laser beam having a first energy onto local regions of the thin film to crystallize the thin film; and illuminating a second laser beam having a second energy lower than the firs energy onto the thin film to partly recrystallize the thin film.

The crystallization and the recrystallization may include sequential lateral solidification and the crystallization and the recrystallization use first and second slits, respectively.

The first slits may include openings and the second slits include translucent films and the first slits and the second slits may have different widths.

The first slits and the second slits may be provided at different masks or a single mask.

A method of manufacturing a thin film transistor is provided, which includes: forming an amorphous silicon thin film on an insulating substrate; forming a polysilicon thin film by locally irradiating the amorphous silicon thin film with a laser beam and crystallizing the amorphous silicon thin film; patterning the polysilicon thin film to form a semiconductor layer; forming a gate insulating layer on the semiconductor layer; forming a gate electrode on the gate insulating layer opposite the semiconductor layer; implanting impurities into the semiconductor layer to form a source region and a drain region opposite each other with respect to the gate electrode; and forming a source electrode and a drain electrode electrically connected to the source region and the drain region, respectively.

The crystallization and the recrystallization may include sequential lateral solidification and the crystallization and the recrystallization use first and second slits, respectively.

The first slits may include openings and the second slits include translucent films and the first slits and the second slits may have different widths.

The first slits and the second slits may be provided at different masks or a single mask.

The method may further include: forming an interlayer insulating layer between the gate electrodes and the source and the drain electrodes and having contact holes exposing the source and the drain regions; forming a passivation layer having a contact hole exposing the drain electrode; and forming a pixel electrode connected to the drain electrode via the contact hole.

The thin film transistor array panel may be used for a liquid crystal display or an organic light emitting display.

BRIEF DESCRIPTION OF THE DRAWINGS

The present invention will become more apparent by describing preferred embodiments thereof in detail with reference to the accompanying drawings in which.

DETAILED DESCRIPTION OF EMBODIMENTS

Figure 1:
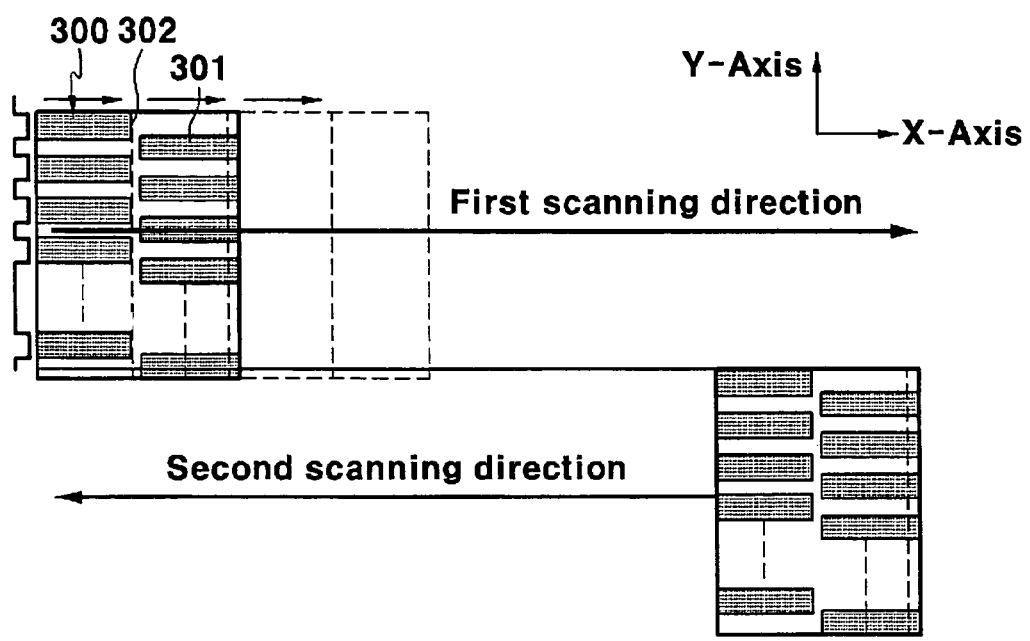
FIG. 1 is a schematic diagram showing a SLS process for crystallizing amorphous silicon into polysilicon.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, a crystallization mask and method and a method of manufacturing a polysilicon TFT according to embodiments of the present invention will be described with reference to accompanying drawings.

Figure 2:
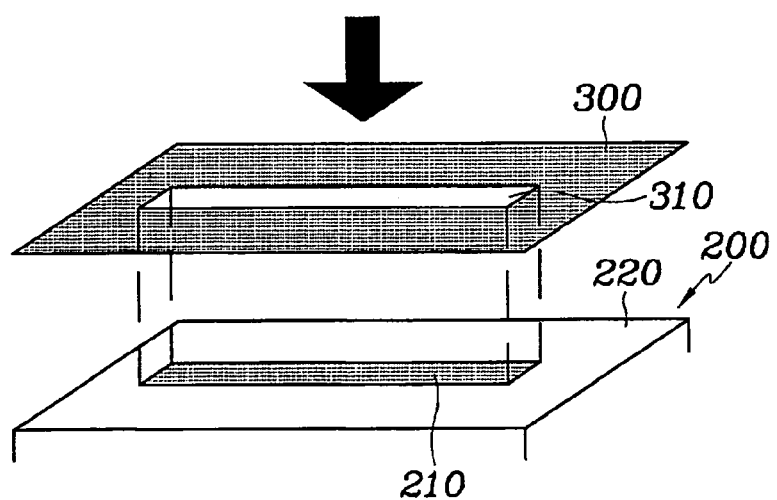
FIG. 2 schematically shows illumination of laser beam through a mask having a slit in the SLS process.
Figure 3A:
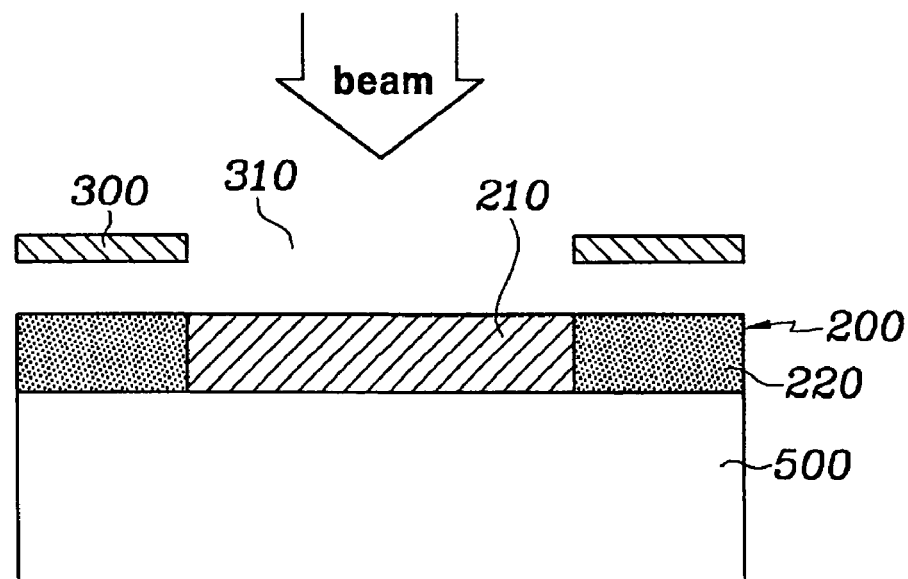
FIGS. 3A–3C schematically show crystallization of amorphous silicon into polysilicon in the SLS process.
Figure 3B:
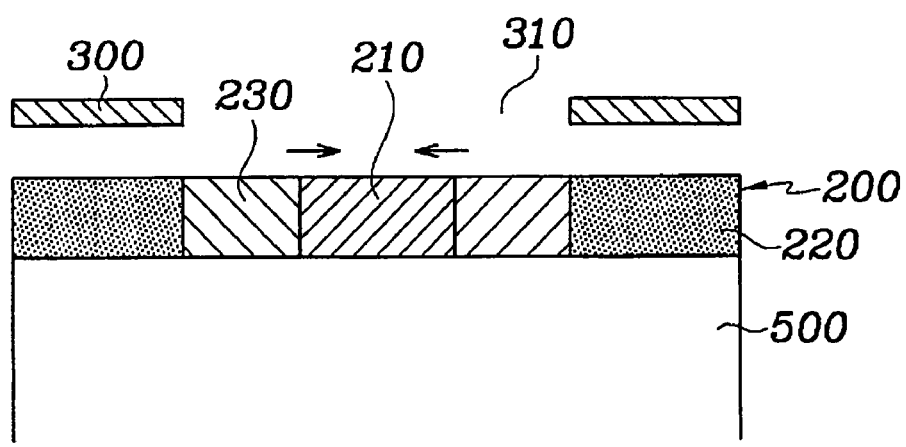
Figure 3C:
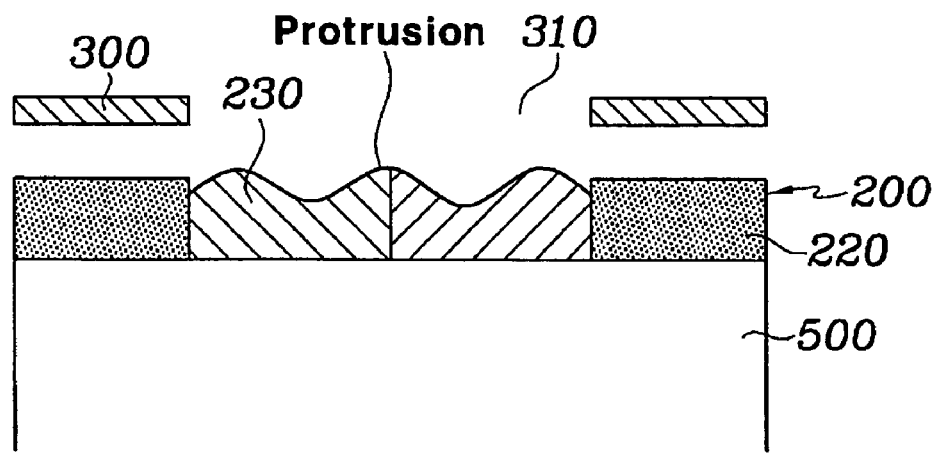
Figure 4:
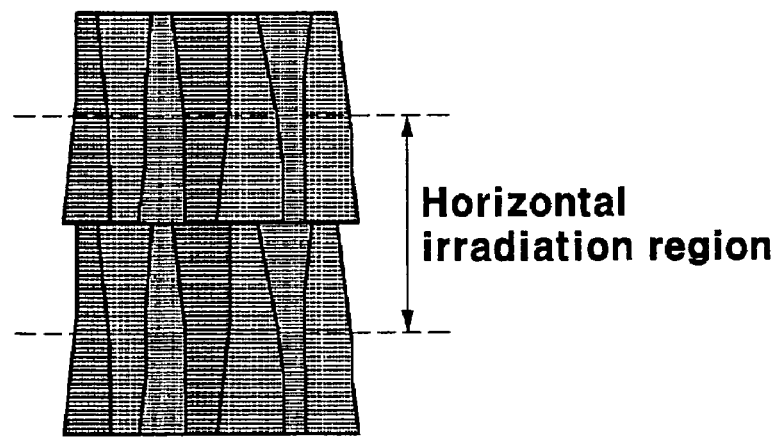
FIG. 4 is a detailed structure of a polycrystalline silicon thin film during crystallization from amorphous silicon to polycrystalline silicon in the sequential lateral solidification process.

FIG. 1 is a schematic diagram showing a SLS process for crystallizing amorphous silicon into polysilicon, FIG. 2 schematically shows illumination of laser beam through a mask having a slit in the SLS process, FIGS. 3A–3C schematically show crystallization of amorphous silicon into polysilicon in the SLS process, and FIG. 4 is a detailed structure of a polycrystalline silicon thin film during crystallization from amorphous silicon to polycrystalline silicon in the sequential lateral solidification process.

As shown in FIG. 2, in the SLS process, a laser beam is illuminated a semiconductor layer 200 made of amorphous silicon and formed on an insulating substrate 500 through a mask 300 having a plurality of transmissive areas 310 in form of slit.

The mask 300 includes a plurality of columns of slits 301 and 302 and each slit in the slit columns 301 and 302 is elongated in a transverse direction. The slits 301 and 302 in each column are arranged with a predetermined pitch, and the slits 301 and 302 in adjacent two columns are offset by about half of the pitch and extensions of the transverse edges of the slits 301 or 302 in a column pass through the slits 302 or 301 in the adjacent column.

Then, the amorphous silicon in a plurality of local regions in the semiconductor layer 200, which is illuminated by the laser beam, is completely melted such that a plurality of liquid phase regions 210 are formed in an area of the semiconductor 200 as shown in FIG. 3A.

At this time, a grain 230 of polycrystalline silicon grows from a boundary surface between a liquid phase region 210 exposed to the laser beam and a solid phase region 220 that does not experience the laser beam along a direction perpendicular to the boundary surface as shown in FIG. 3B. The grains 230 stop growing when they meet at the center of the liquid phase region. They are grown to have a various size of a desired degree by performing the step along the growing direction of the grains to continue the lateral growth of the grains.

The SLS process illustrated in FIG. 1 moves the substrate by a width of the column in the transverse direction (i.e., x direction) with respect to the mask 300 after irradiating laser beams through the mask (referred to as a shot). Since the slits 301 and 302 are elongated in the x direction, the grain growth proceeds in the y direction by a width of the slits 301 and 302 as shown in FIG. 4.

The movement of the substrate 500 is performed by a stage mounting the substrate while a laser irradiation device is fixed.

However, the poly-crystallized semiconductor layer 200 may have protrusions along the grain growth as shown in FIG. 3C. In order to remove the protrusions, a mask having means for adjusting the energy of the laser beam incident on the semiconductor layer 200 is used, which will be described in detail with reference FIGS. 5, 6A and 6B.

Figure 5:
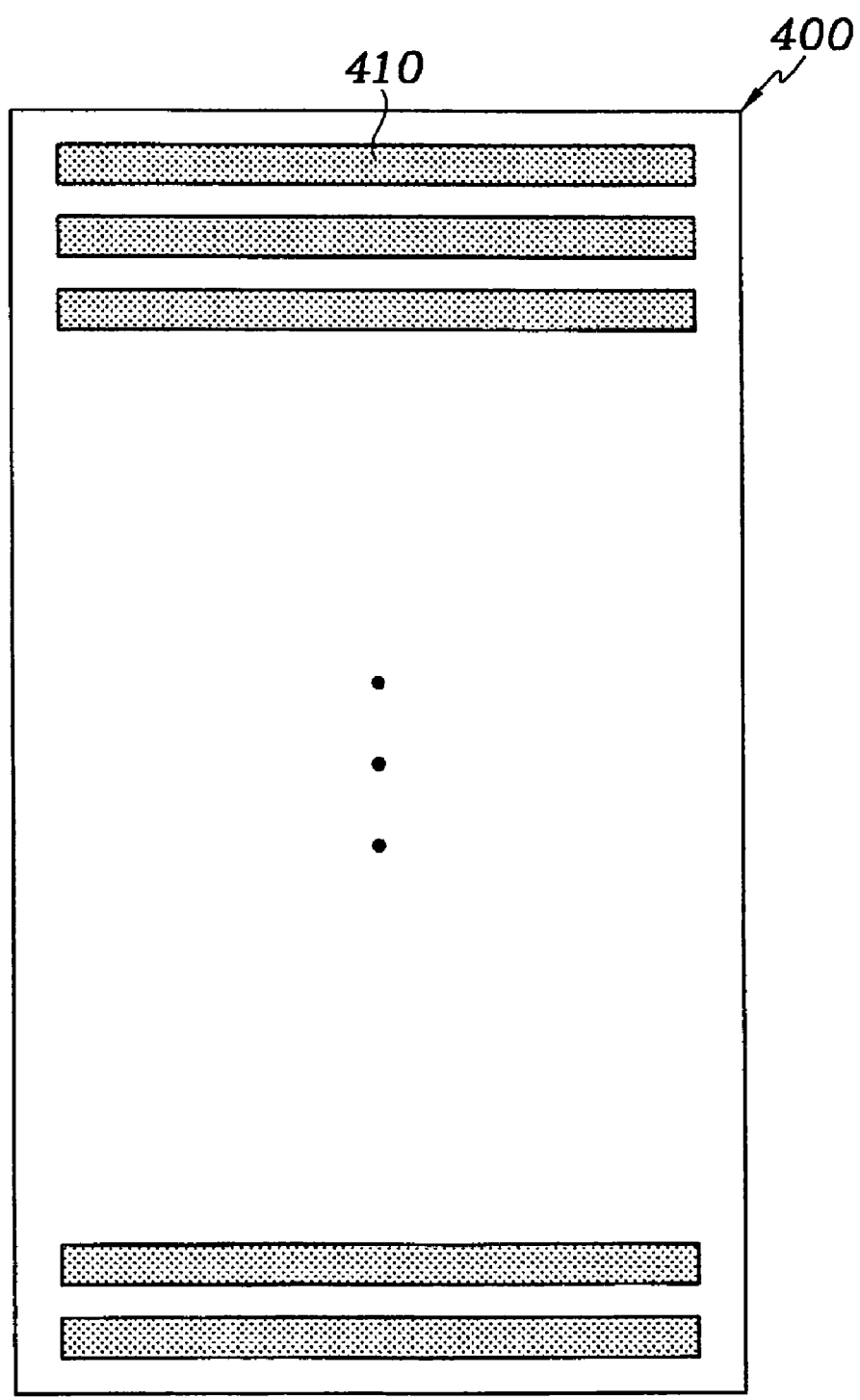
FIG. 5 is a schematic view of a crystallization mask according to an embodiment of the present invention.
Figure 6A:
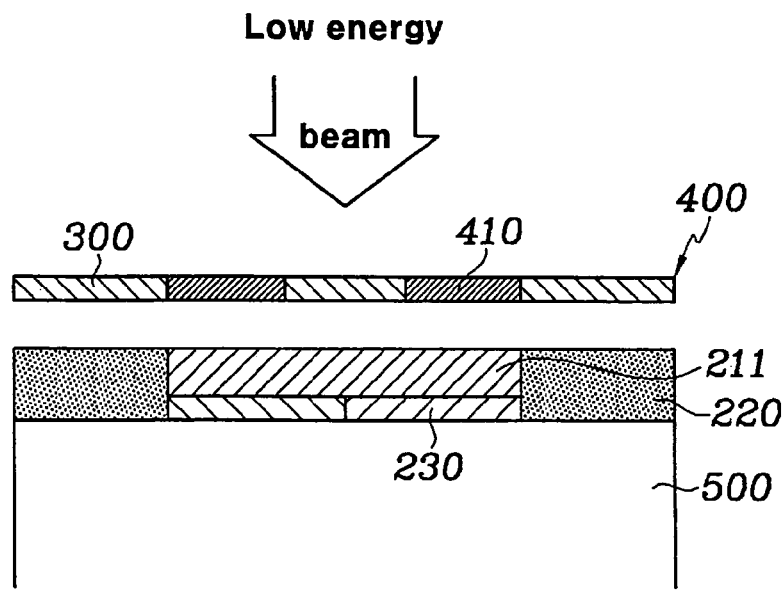
FIGS. 6A and 6B schematically illustrate the removal of the protrusions according to an embodiment of the present invention.
Figure 6B:
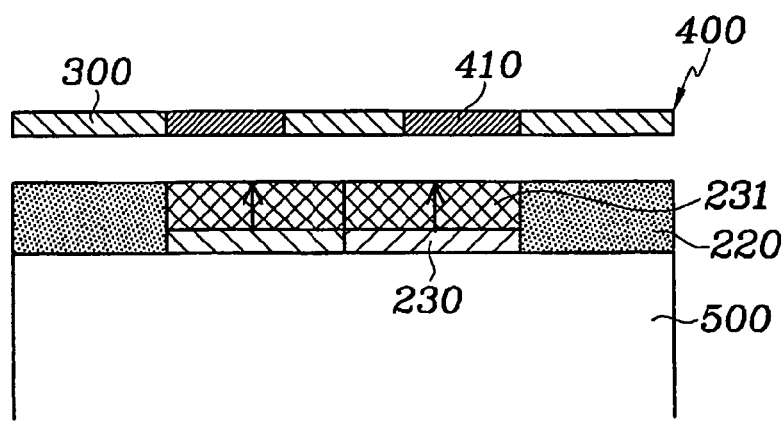

FIG. 5 is a schematic view of a crystallization mask according to an embodiment of the present invention, and FIGS. 6A and 6B schematically illustrate the removal of the protrusions according to an embodiment of the present invention.

Referring to FIG. 5, a crystallization mask 400 according to this embodiment includes a plurality of slits 410 including translucent films for adjusting the energy of the laser beam passing therethrough. The slits 410 are arranged in a column and elongated in a transverse direction. The slits 410 have a width smaller than those of the mask shown in FIG. 1, and they preferably have a width and an interdistance corresponding to the protrusions.

After the crystallization shown in FIGS. 3A–3C, a laser beam is illuminated again through the mask 400 shown in FIG. 5. The mask 400 moves in the transverse direction and it is aligned so that the slits 410 face the protrusions. Although the laser beam has an energy sufficient for fully melting the semiconductor layer 200, the translucent film in the slits 410 absorbs a part of the energy such that the semiconductor layer 200 is not fully melted. For example, upper portions of the semiconductor layer 200 are melted to form liquid phase regions 211, while lower portions thereof are not melted. Therefore, the protrusions are removed.

Referring to FIG. 6B, the melted portions of the semiconductor layer 200 are recrystallized into polysilicon 231 and the grain growth also starts from the boundary in a perpendicular manner.

Figure 7:
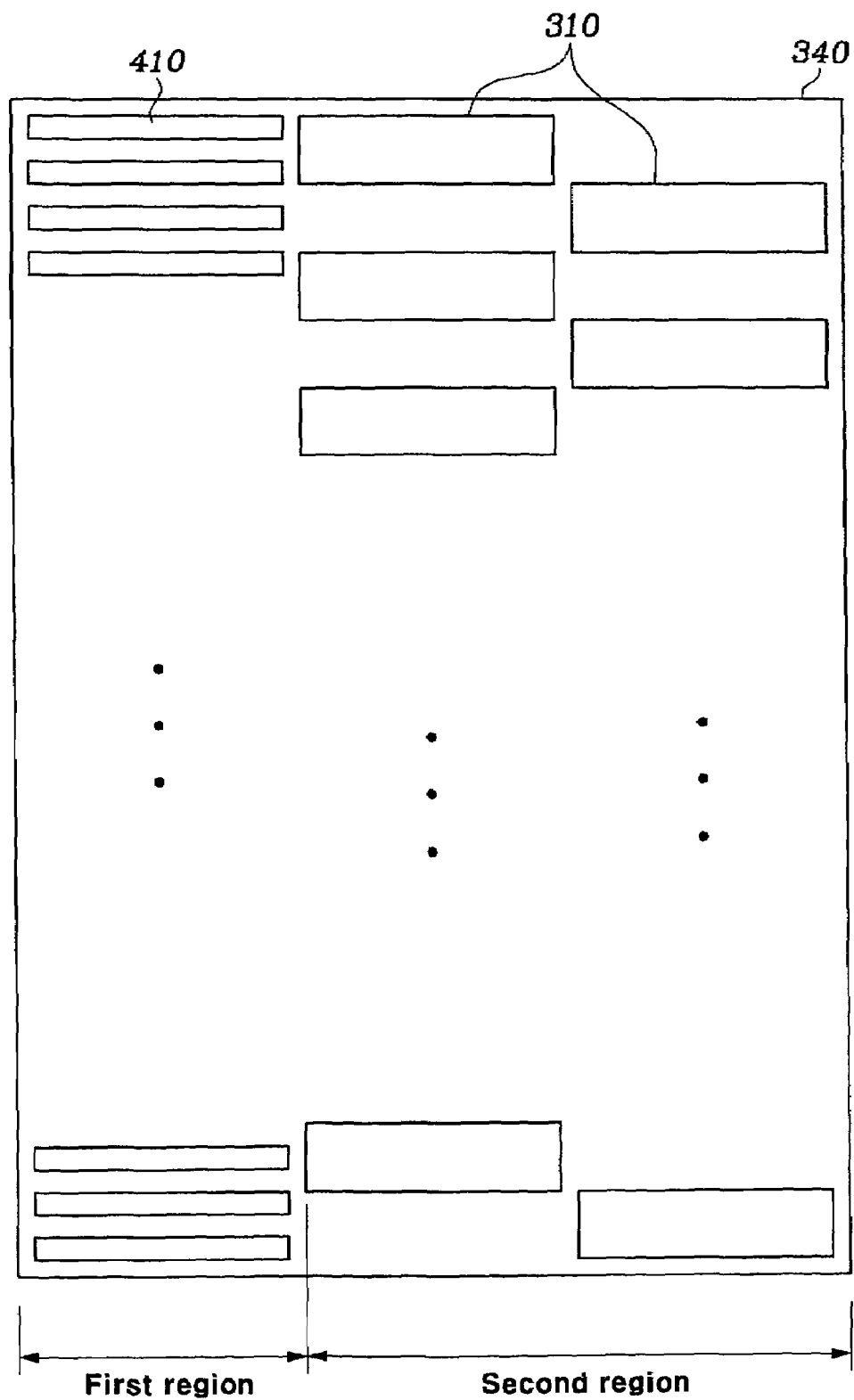
FIG. 7 is a plan view of a crystallization mask according to another embodiment of the present invention.

FIG. 7 is a plan view of a crystallization mask according to another embodiment of the present invention.

Referring to FIG. 7 a mask 340 according to this embodiment includes a plurality of areas having different transmittance. That is, slits 310 shown in FIG. 1 and the slits 410 shown in FIG. 5 are formed in the mask.

When using the mask 430 shown in FIG. 7, the slits 310 is used for crystallization and the slits 410 is used for recrystallization. That is, the crystallization is performed using the slits 310 and thereafter, the protrusions are removed by using the slits 410 to recrystallize.

Now, a TFT array panel for OLED according to an embodiment of the present invention is described in detail with reference to FIGS. 8–10.

Figure 8:
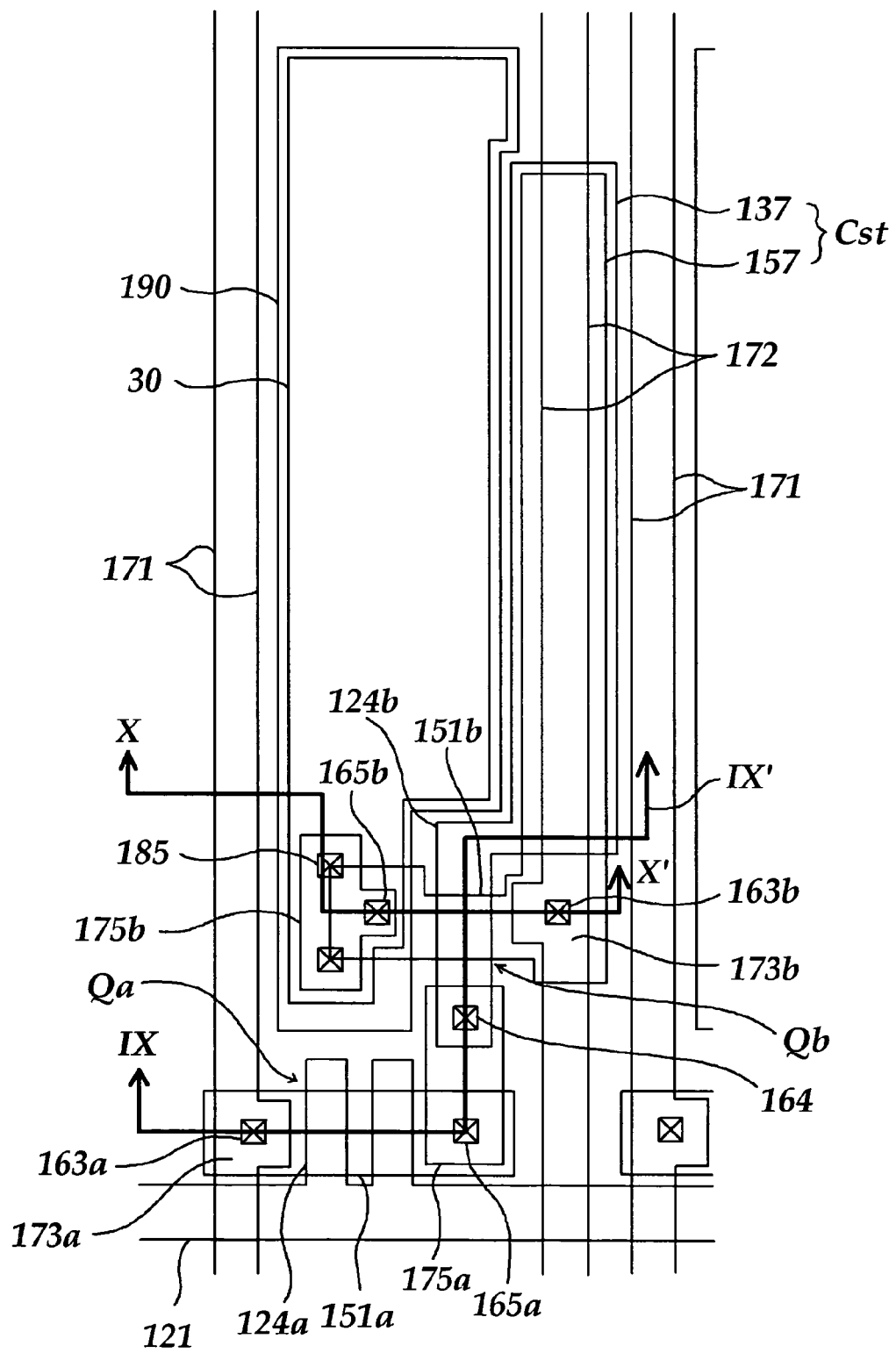
FIG. 8 is a layout view of a TFT array panel for an OLED according to an embodiment of the present invention.
Figure 9:
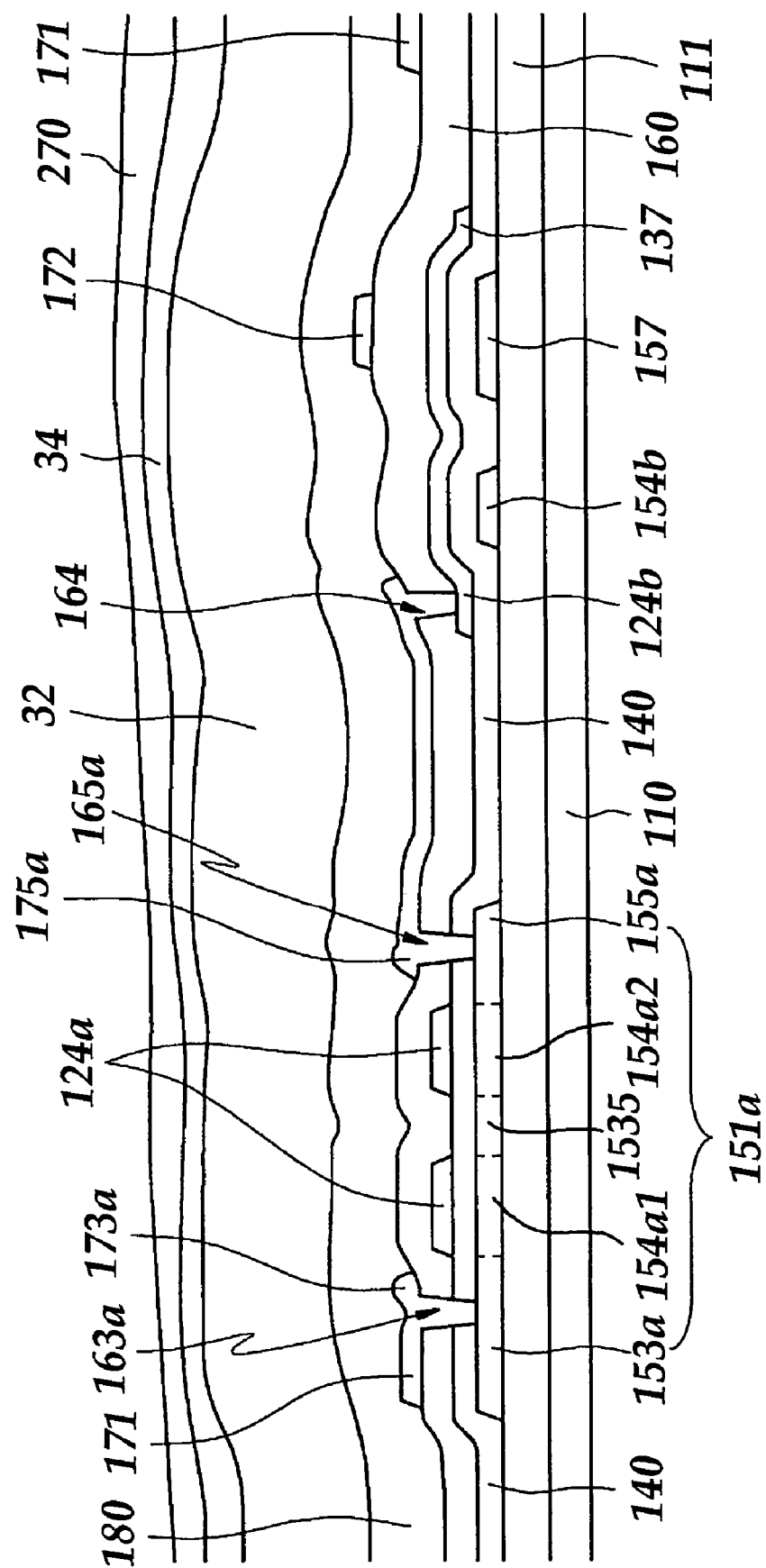
FIG. 9 is a sectional view of the TFT array panel shown in FIG. 8 taken along the line IX–IX'.
Figure 10:
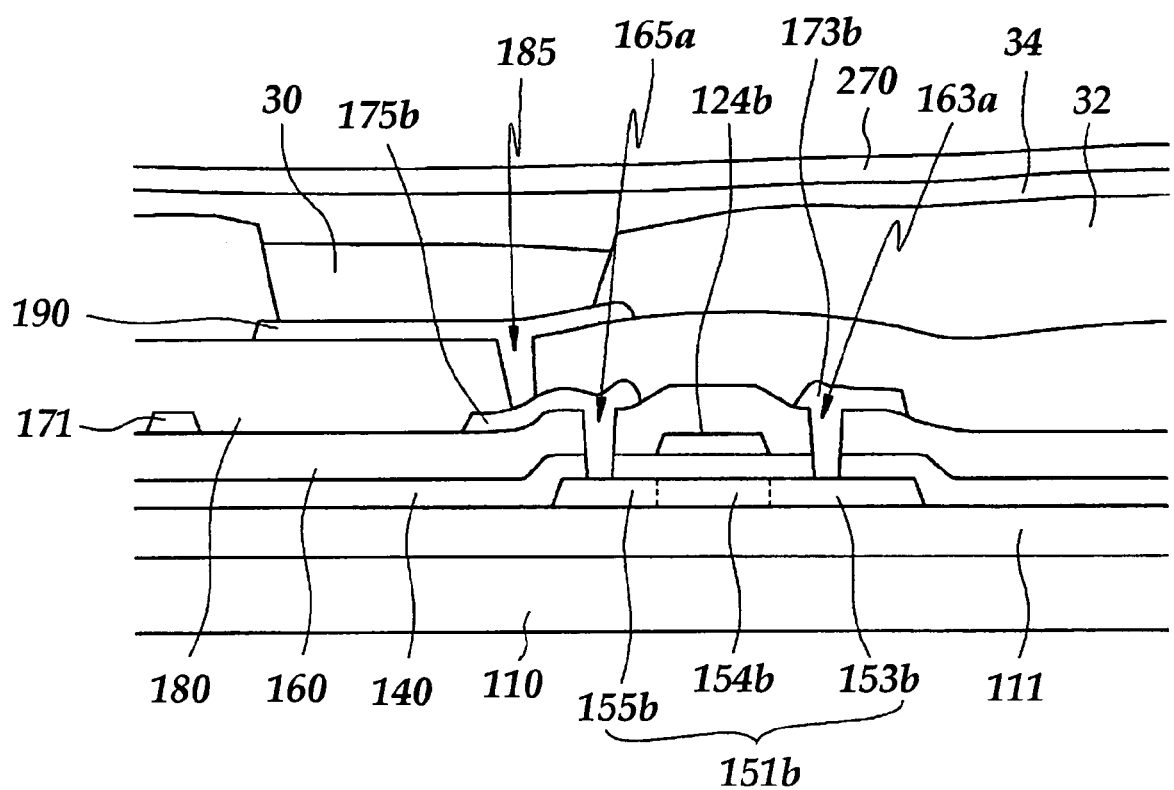
FIG. 10 is a sectional view of the TFT array panel shown in FIG. 8 taken along the line X–X'.

FIG. 8 is a layout view of a TFT array panel for an OLED according to an embodiment of the present invention, FIG. 9 is a sectional view of the TFT array panel shown in FIG. 8 taken along the line IX–IX', and FIG. 10 is a sectional view of the TFT array panel shown in FIG. 8 taken along the line X–X'.

A blocking layer 111 preferably made of silicon oxide or silicon nitride is formed on an insulating substrate 110 preferably made of transparent glass. The blocking film 111 may have a dual-layered structure.

A plurality of semiconductor islands 151a and 151b preferably made of polysilicon are formed on the blocking film 111. Each of the semiconductor islands 151a and 151b includes a plurality of extrinsic regions containing N type or P type conductive impurity and at least one intrinsic region hardly containing conductive impurity.

Regarding a semiconductor island 151a for a switching TFT Qa, the extrinsic regions include a first source region 153a, an intermediate region 1535, and a first drain region 155a, which are doped with N type impurity and separated from one another, and the intrinsic regions include such as a pair of (first) channel regions 154a1 and 154a2 disposed between the extrinsic regions 153a, 1535 and 155a.

Concerning a semiconductor island 151b for a driving TFT Qb, the extrinsic regions include a second source region 153b and a second drain region 155b, which are doped with P type impurity and separated from one another, and the intrinsic region includes a channel region 154b disposed between the second source region 153b and the second drain region 155b. The second source region 153b extends to form a storage region 157.

The extrinsic regions may further include lightly doped regions (not shown) disposed between the channel regions 154a1, 154a2 and 154b and the source and the drain regions 153a, 155a, 153b and 155b. The lightly doped regions may be substituted with offset regions that contain substantially no impurity.

Alternatively, the extrinsic regions 153a and 155a of the first semiconductor islands 151a are doped with P type impurity, while the extrinsic regions 153b and 155b of the second semiconductor islands 151b are doped with N type impurity, depending on driving conditions. The conductive impurity includes P type impurity such as boron (B) and gallium (Ga) and N type impurity such as phosphorous (P) and arsenic (As).

A gate insulating layer 140 preferably made of silicon oxide or silicon nitride is formed on the semiconductor islands 151a and 151b and the blocking film 111.

A plurality of gate conductors including a plurality of gate lines 121 including a plurality of pairs of first gate electrodes 124a and a plurality of second gate electrodes 124b are formed on the gate insulating layer 140.

The gate lines 121 for transmitting gate signals extend substantially in a transverse direction. Each pair of first gate electrodes 124a protrude upward from the gate line 121 and they intersect the first semiconductor islands 151a such that they overlap the pair of the first channel regions 154a. Each gate line 121 may include an expanded end portion having a large area for contact with another layer or an external driving circuit. The gate lines 121 may be directly connected to a gate driving circuit for generating the gate signals, which may be integrated on the substrate 110.

The second gate electrodes 124b are separated from the gate lines 121 and intersect the second semiconductor islands 151b such that they overlap the second channel regions 154b. The second gate electrodes 124b extend to form storage electrodes 137 overlapping the storage electrode regions 157 of the second semiconductor islands 151b to form storage capacitors Cst.

The gate conductors 121 and 124b are preferably made of low resistivity material including Al containing metal such as Al and Al alloy (e.g. Al—Nd), Ag containing metal such as Ag and Ag alloy, and Cu containing metal such as Cu and Cu alloy. The gate conductors 121 and 124b may have a multi-layered structure including two films having different physical characteristics. One of the two films is preferably made of low resistivity metal including Al containing metal, Ag containing metal, and Cu containing metal for reducing signal delay or voltage drop in the gate conductors 121 and 124b. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film.

In addition, the lateral sides of the gate conductors 121 and 124b are inclined relative to a surface of the substrate 110, and the inclination angle thereof ranges about 30–80 degrees.

An interlayer insulating film 160 is formed on the gate conductors 121 and 124b. The interlayer insulating layer 160 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The interlayer insulating layer 160 has a plurality of contact holes 164 exposing the second gate electrodes 124b. In addition, the interlayer insulating layer 160 and the gate insulating layer 140 have a plurality of contact holes 163a, 163b, 165a and 165b exposing the source regions 153a and 153b and the drain regions 155a and 155b, respectively.

A plurality of data conductors including a plurality of data lines 171, a plurality of voltage transmission lines 172, and a plurality of first and second drain electrodes 175a and 175b are formed on the interlayer insulating film 160. The data lines 171 for transmitting data signals extend substantially in the longitudinal direction and intersect the gate lines 121. Each data line 171 includes a plurality of first source electrodes 173a connected to the first source regions 153a through the contact holes 163a. Each data line 171 may include an expanded end portion having a large area for contact with another layer or an external driving circuit. The data lines 171 may be directly connected to a data driving circuit for generating the gate signals, which may be integrated on the substrate 110.

The voltage transmission lines 172 for transmitting driving voltages for the driving TFT Qb extend substantially in the longitudinal direction and intersect the gate lines 121. Each voltage transmission line 172 includes a plurality of second source electrodes 173b connected to the second source regions 153b through the contact holes 163b. The voltage transmission lines 171 may be connected to each other.

The first drain electrodes 175a are separated from the data lines 171 and the voltage transmission lines 172 and connected to the first drain regions 155a through the contact holes 165 and to the second gate electrodes 124b through the contact hole 164.

The second drain electrodes 175b are separated from the data lines 171 and the voltage transmission lines 172 and connected to the second drain regions 155b through the contact holes 165b.

The data conductors 171, 172, 175a and 175b are preferably made of refractory metal including Cr, Mo, Ti, Ta or alloys thereof. They may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film.

Like the gate conductors 121 and 124b, the data conductors 171, 172, 175a and 175b have tapered lateral sides relative to the surface of the substrate 110, and the inclination angles thereof range about 30–80 degrees.

A passivation layer 180 is formed on the data conductors 171, 172, 175a and 175b. The passivation layer 180 is also preferably made of photosensitive organic material having a good flatness characteristic, low dielectric insulating material such as a-Si:C:O and a-Si:O:F formed by PECVD, or inorganic material such as silicon nitride and silicon oxide.

The passivation layer 180 has a plurality of contact holes 185 exposing the second drain electrodes 175b. The passivation layer 180 may further has a plurality of contact holes (not shown) exposing end portions of the data lines 171 and the passivation layer 180 and the interlayer insulating layer 160 may have a plurality of contact holes (not shown) exposing end portions of the gate lines 121.

A plurality of pixel electrodes 190 are formed on the passivation layer 180. The pixel electrodes 190 are connected to the second drain electrodes 175b through the contact holes 185 and they are preferably made of at least one of reflective opaque material such as Al or Ag alloy. However, the pixel electrode 190 may be made of transparent conductor such as ITO or IZO and opaque reflective conductor such as Al, Ag, Ca, Ba and Mg. The pixel electrode 190 may be incorporated with the second drain electrode 175b for reducing the manufacturing cost.

A plurality of contact assistants or connecting members (not shown) may be also formed on the passivation layer 180 such that they are connected to the exposed end portions of the gate lines 121 or the data lines 171.

A partition 32 for separating pixels of the TFT array panel is formed on the passivation layer 180 and the pixel electrodes 190. The partition 32 surrounds the pixel electrodes 190 like a bank to define openings to be filled with organic light emitting material. The partition 32 is preferably made of organic insulating material and, more preferably, made of a photosensitive material containing black pigment, which is exposed to light and developed, such that the partition 32 functions as a light blocking member and a manufacturing method thereof is simplified.

A plurality of light emitting members 30 are formed on the pixel electrodes 190 and disposed in the openings defined by the partition 32. The light emitting members 30 are preferably made of organic material emitting primary-color lights such as red, green and blue lights. The red, green and blue light emitting members 30 are periodically arranged.

A buffer layer 34 is formed on the light emitting members 30 and the partition 32. The buffer layer 34 may be omitted if it is not required.

A common electrode 270 supplied with a predetermined voltage such as a common voltage is formed on the buffer layer 34. The common electrode 270 is preferably made of transparent conductive material such as ITO and IZO or opaque metal such as Al, Ag, Ca, Ba and Mg.

An auxiliary electrode (not shown) made of low resistivity material is optionally provided for compensating the conductivity of the common electrode 270. The auxiliary electrode may be disposed between the common electrode 270 and the buffer layer 34 or on the common electrode 270, and it preferably has a matrix form and is disposed along the partition 32 such that it does not overlap the light emitting member 30.

In the above-described TFT array panel, a first semiconductor island 151a, a first gate electrode 124a connected to the gate line 121, a first source electrode 153a connected to the data line 171, and a first drain electrode 155a form a switching TFT Qa. In addition, a second semiconductor island 151b, a second gate electrode 124b connected to the first drain electrode 155a, a second source electrode 153b connected to the voltage transmission line 172, and a second drain electrode 155b connected to a pixel electrode 190 form a driving TFT Qb. Furthermore, a pixel electrode 190 and a common electrode 270 serve as an anode and a cathode, respectively, and a storage region 157 connected to a first drain region 155a and a storage electrode 137 connected to a voltage transmission line 172 through a second source electrode 153b form a storage capacitor Cst.

The switching TFT Qa transmits data signals from the data line 171 to the driving TFT Qb in response to the gate signal from the gate line 121. Upon the receipt of the data signal, the driving TFT Qb generates a current having a magnitude depending on the voltage difference between the second gate electrode 124b and the second source electrode 173b. In addition, the voltage difference is charged in the storage capacitor Cst to be maintained after the switching TFT Qa is turned off. The current driven by the driving TFT Qb enters into the light emitting member 30 through the pixel electrode 190 and reaches the common electrode 270. The current flowing in the light emitting member 30 means that positive charge carriers such as holes and negative charge carriers such as electrons are injected into the light emitting member 30 from the anode 190 and the cathode 270, respectively, and they are drifted by an electric field generated by the voltage difference between the anode 190 and the cathode 270. The holes and the electrons in the light emitting member 30 then meet each other to be recombined into excitons, which emit light with a predetermined wavelength. The intensity of the emitted light depends on the current driven by the driving TFT Qb and flowing in the light emitting member 30.

The emitted light goes out of the display panel after passing through the common electrode 270 or the pixel electrode 190. A transparent common electrode 270 and an opaque pixel electrode 190 are applicable to a top emission type EL display, which displays an image on its top surface. On the contrary, a transparent pixel electrode 190 and an opaque common electrode 270 are applicable to a bottom emission type EL display, which displays an image on its bottom surface.

Now, a method of manufacturing the TFT array panel shown in FIGS. 8–10 is described with reference to FIGS. 11–24B as well as FIGS. 8–10.

FIGS. 11, 13, 15, 17, 19, 21 and 23 are layout views of the TFT array panel shown in FIGS. 8–10 in intermediate steps of a manufacturing method thereof according to an embodiment of the present invention, FIGS. 12A, 14A, 16A, 18A, 20A, 22A and 24A are sectional views of the TFT array panels shown in FIGS. 11, 13, 15, 17, 19, 21 and 23 taken along the lines XIIA–XIIA', XIVA–XIVA', XVIA–XVIA', XVIIIA–XVIIIA', XXA–XXA', XXIIA–XXIIA', and XXIVA–XXIVA', respectively, and FIGS. 12B, 14B, 16B, 18B, 20B, 22B and 24B are sectional views of the TFT array panels shown in FIGS. 11, 13, 15, 17, 19, 21 and 23 taken along the lines XIIIB–XIIIB', XIVB–XIVB', XVIB–XVIB', XVIIIB–XVIIIB', XXB–XXB', XXIIB–XXIIB', and XXIVB–XXIVB', respectively.

A blocking layer 111 is formed on an insulating substrate 110, and a semiconductor layer made of amorphous silicon is deposited on the blocking layer 111 preferably by LPCVD (low temperature chemical vapor deposition), PECVD (plasma enhanced chemical vapor deposition) or sputtering.

The semiconductor layer is subjected to SLS with masks shown in FIG. 5 or 7 to be crystallized. As described above, the masks shown in FIGS. 5 and 7 can remove protrusions generated during the SLS.

Figure 11:
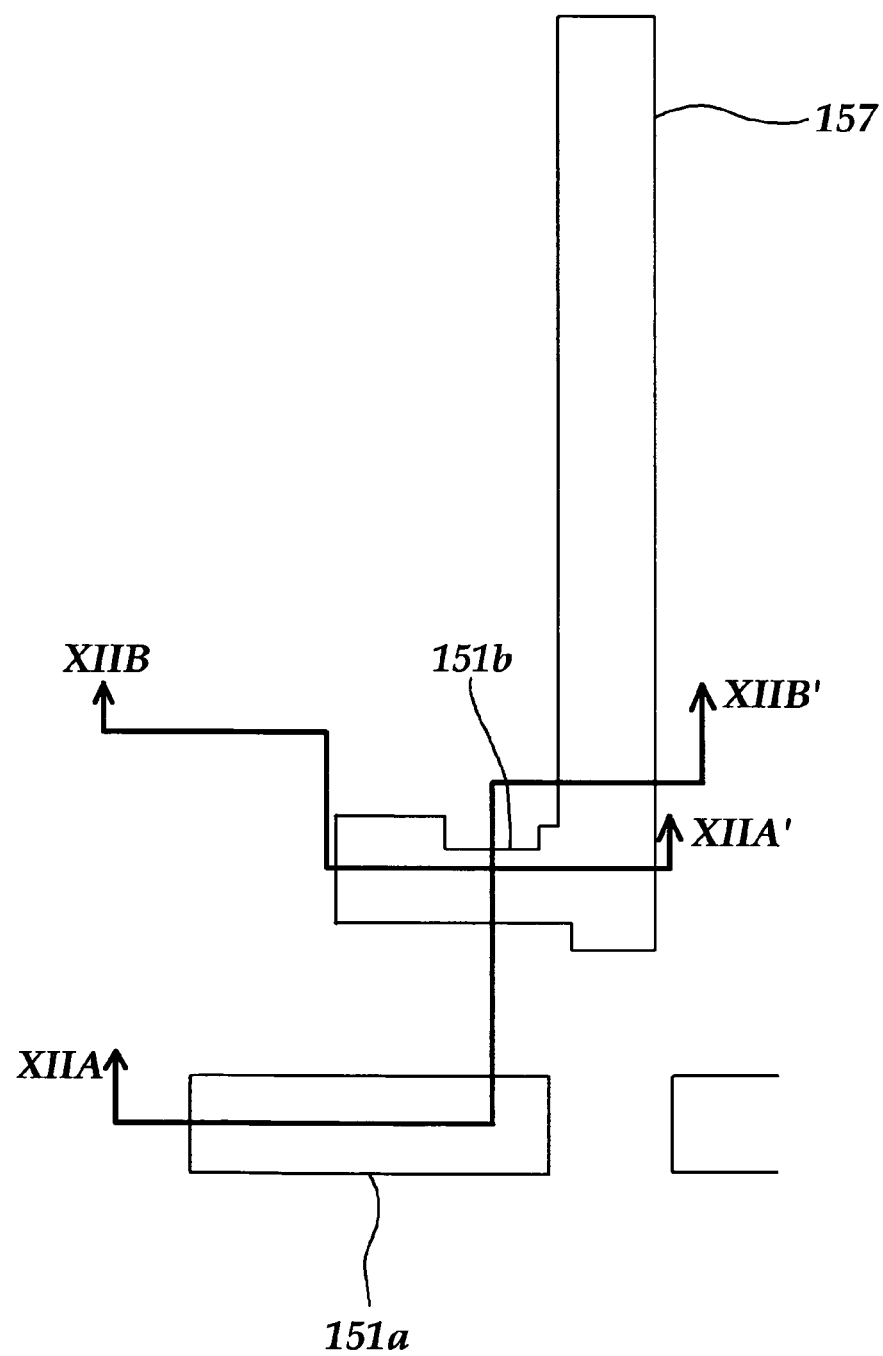
FIGS. 11, 13, 15, 17, 19, 21 and 23 are layout views of the TFT array panel shown in FIGS. 8–10 in intermediate steps of a manufacturing method thereof according to an embodiment of the present invention.
Figure 12A:
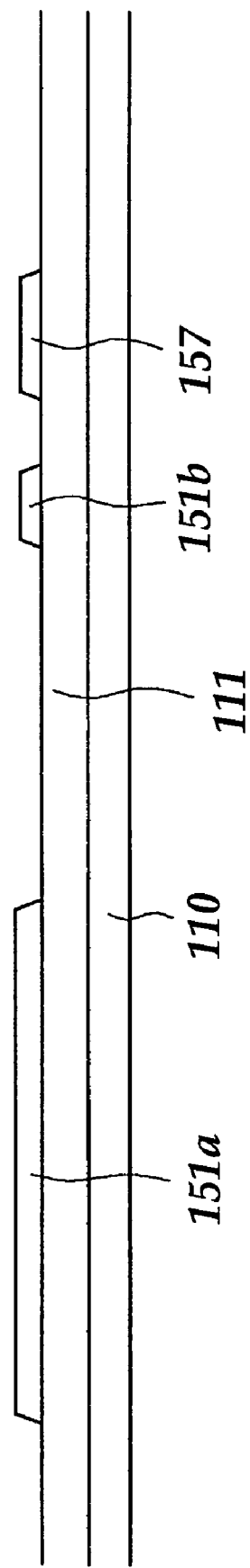
FIGS. 12A, 14A, 16A, 18A, 20A, 22A and 24A are sectional views of the TFT array panels shown in FIGS. 11, 13, 15, 17, 19, 21 and 23 taken along the lines XIIA–XIIA', XIVA–XIVA', XVIA–XVIA', XVIIIA–XVIIIA', XXA–XXA', XXIIA–XXIIA', and XXIVA–XXIVA', respectively.
Figure 12B:
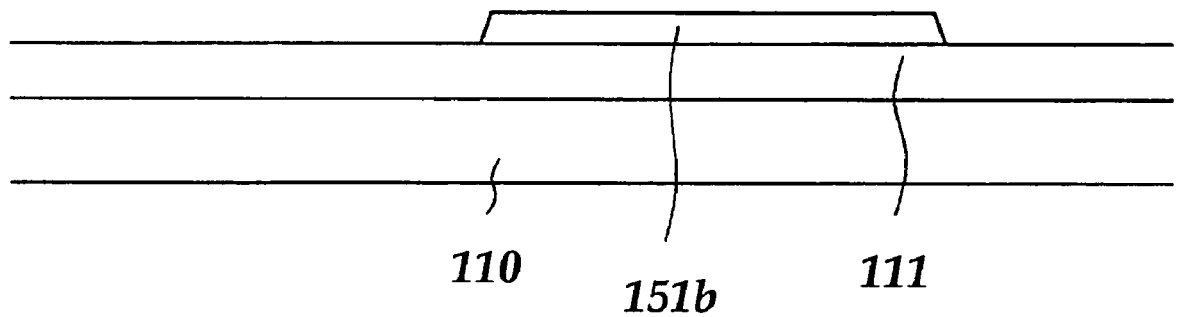
FIGS. 12B, 14B, 16B, 18B, 20B, 22B and 24B are sectional views of the TFT array panels shown in FIGS. 11, 13, 15, 17, 19, 21 and 23 taken along the lines XIIB–XIIB', XIVB–XIVB', XVIB–XVIB', XVIIIB–XVIIIB', XXB–XXB', XXIIB–XXIIB', and XXIVB–XXIVB', respectively.

Next, the semiconductor layer is photo-etched to form a plurality of pairs of first and second semiconductor islands 151a and 151b as shown in FIGS. 11–12B.

Figure 13:
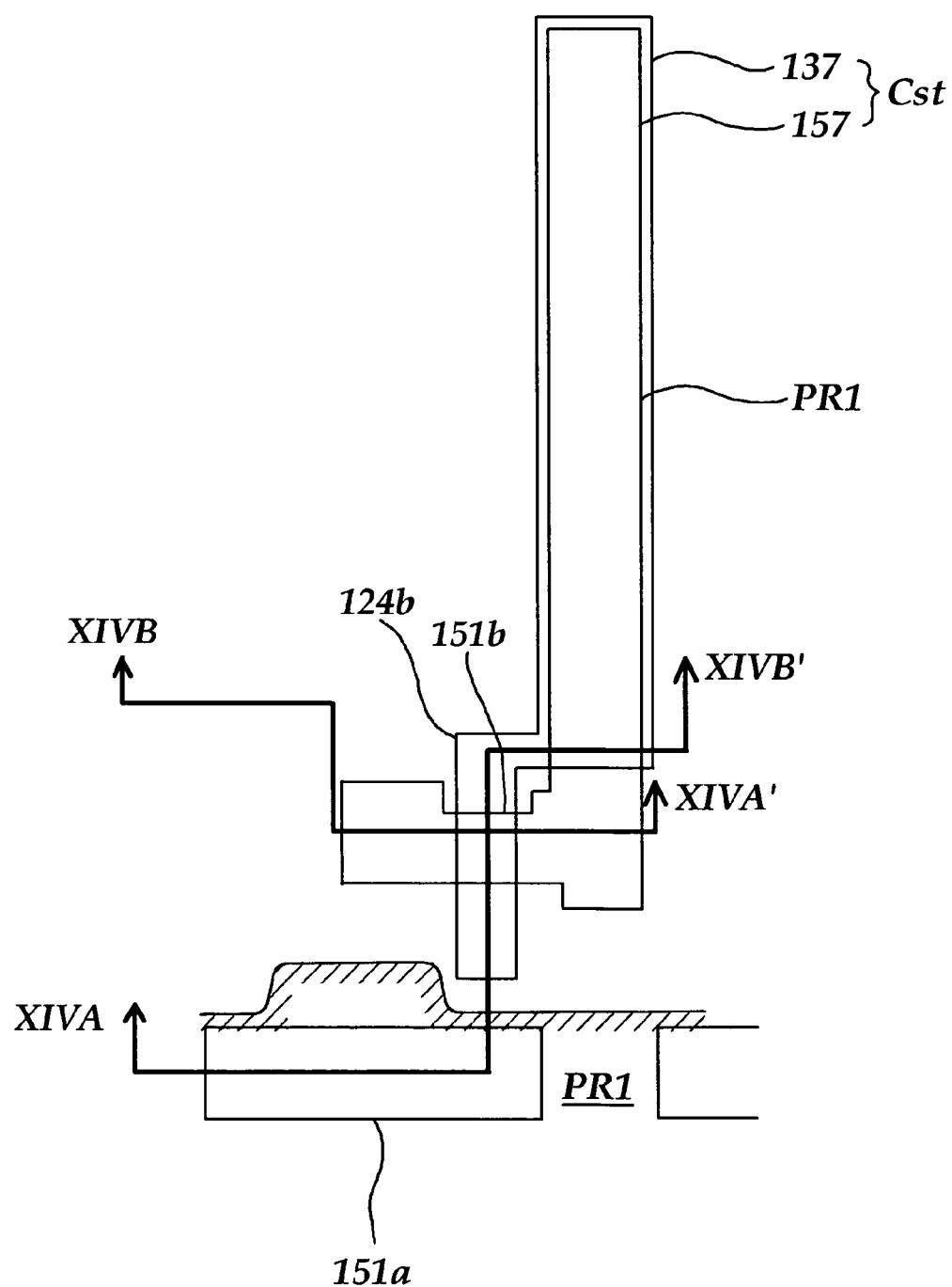
Figure 14A:
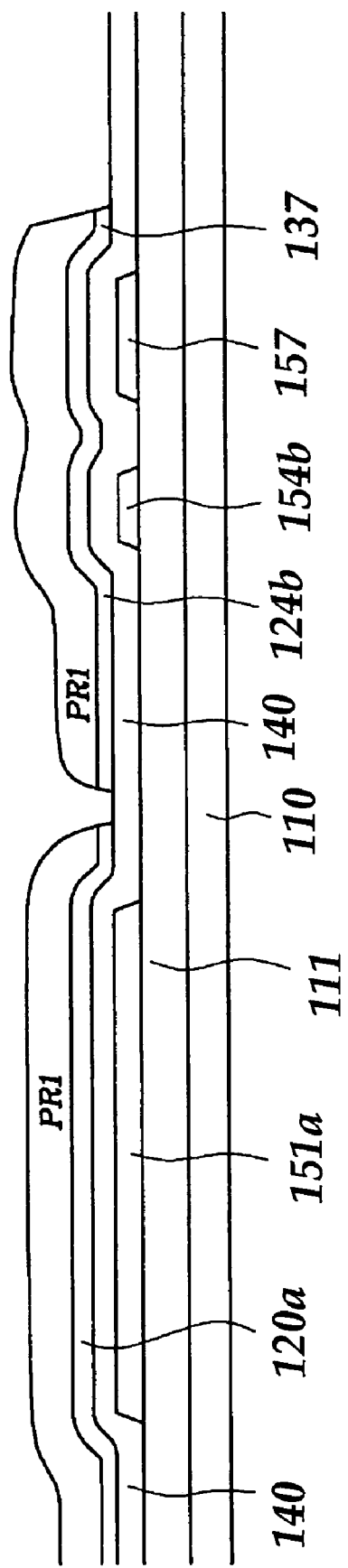
Figure 14B:
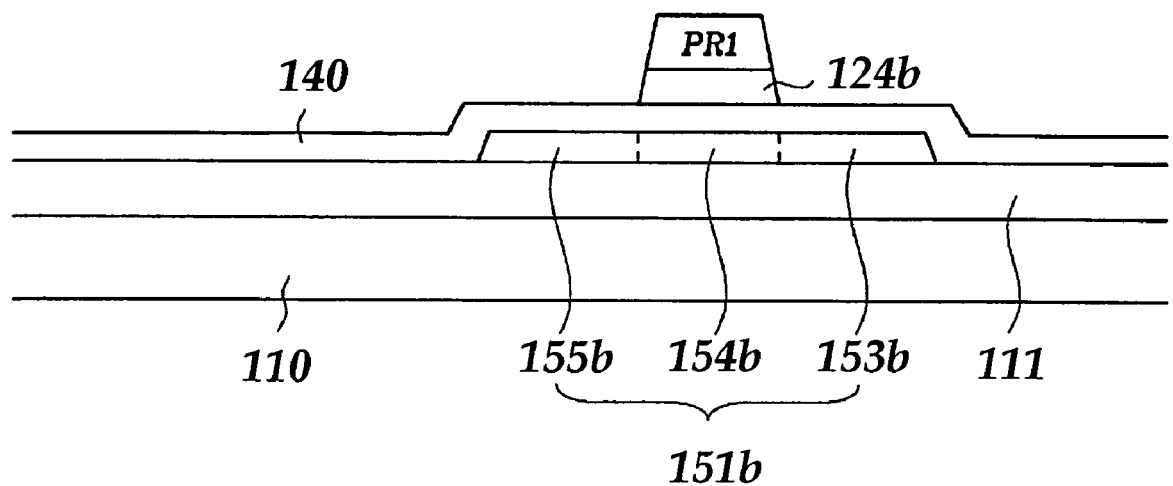

Referring to FIGS. 13–14B, a gate insulating layer 140 and a gate metal layer are sequentially deposited on the gate insulating layer 140 and a first photoresist PR1 is formed thereon. The gate metal layer is etched by using the first photoresist PR1 as an etch mask to form a plurality of gate electrodes 124b including storage electrodes 137 and a plurality of gate metal members 120a. P type impurity is introduced into portions of the second semiconductor islands 151b, which are not covered with the gate electrodes 124b and the gate metal members 120a as well as the first photoresist PR1, to form a plurality of P type extrinsic regions 153b and 155b. At this time, the first semiconductor islands 151a are covered with the first photoresist PR1 and the gate metal members 120a to be protected from impurity implantation.

Figure 15:
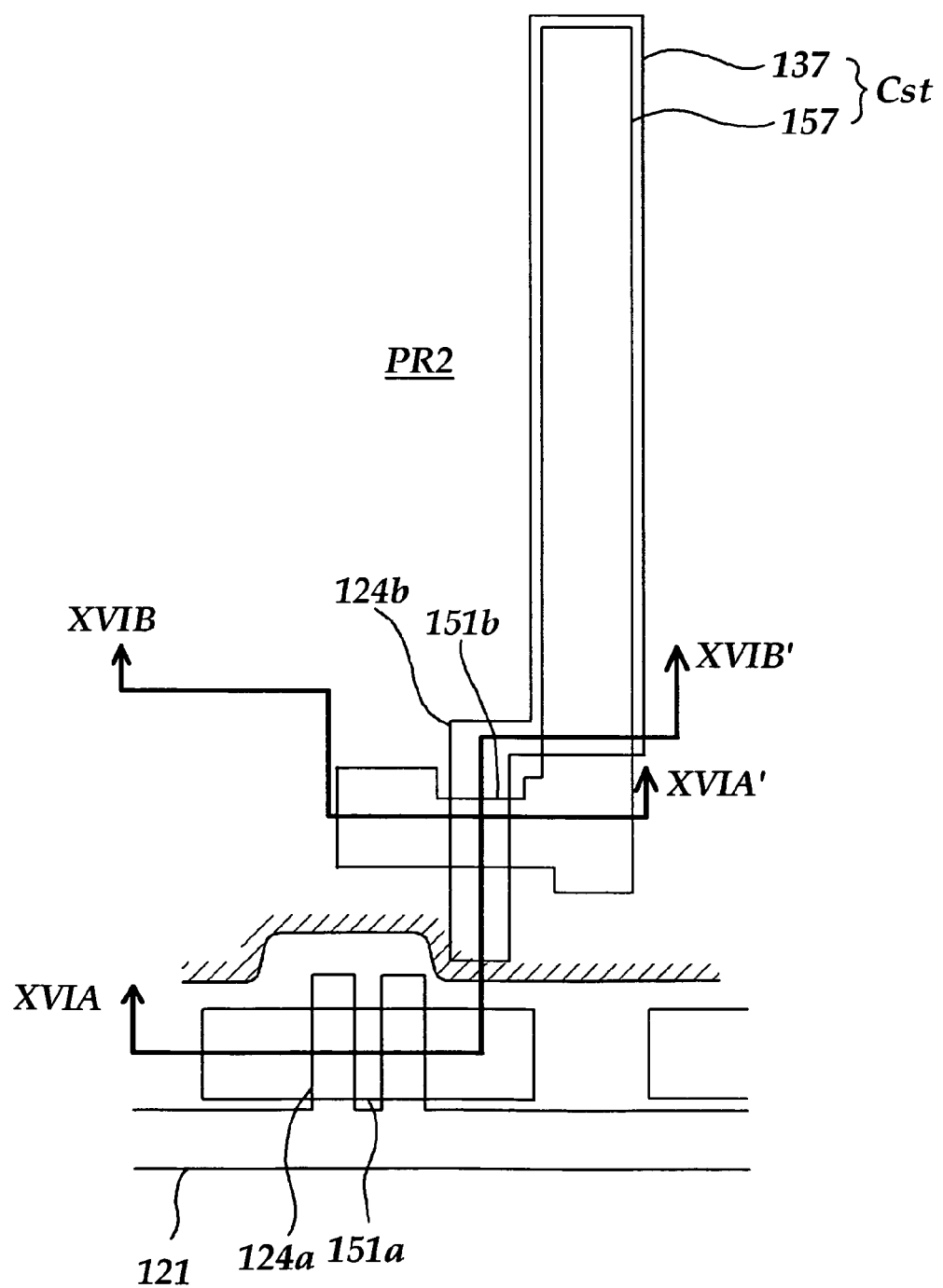
Figure 16A:
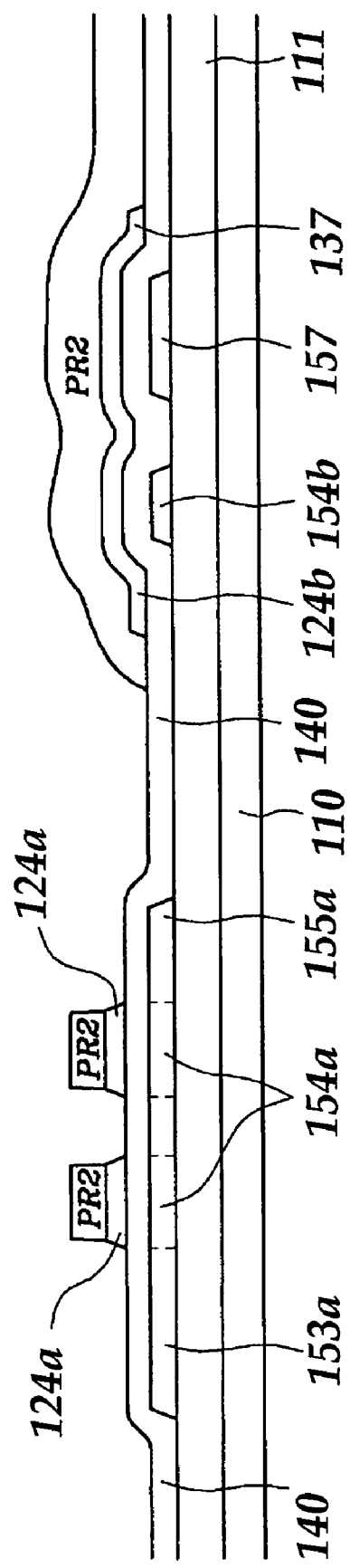
Figure 16B:
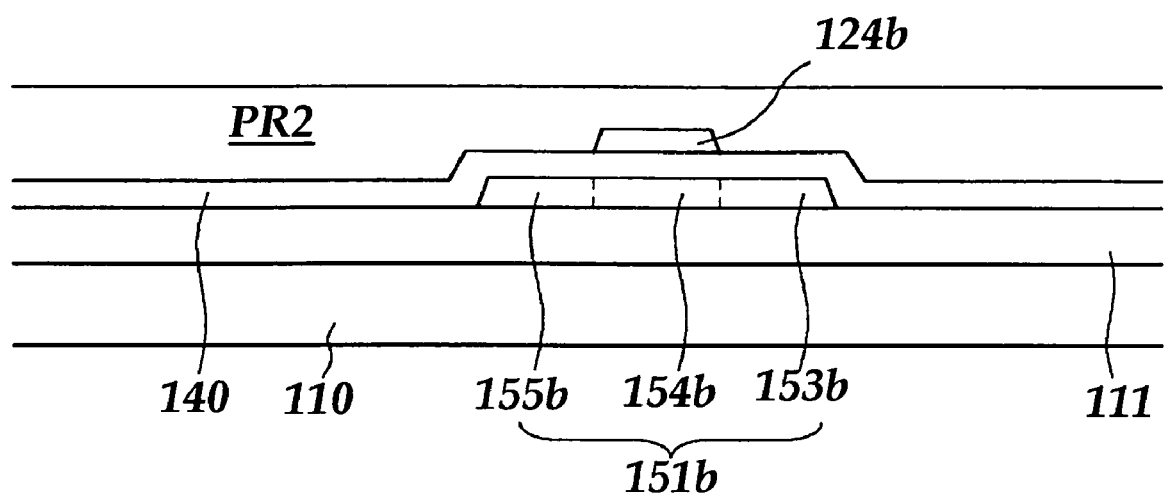

Referring to FIGS. 15–16B, the first photoresist PR1 is removed and a second photoresist PR2 is formed. The gate metal members 120a is etched by using the second photoresist PR2 as an etch mask to form a plurality of gate lines 121 including gate electrodes 124a. N type impurity is injected into portions of the first semiconductor islands 151a, which are not covered with the gate lines 121 and the gate electrodes 124b as well as the second photoresist PR2, to form a plurality of N type extrinsic regions 153a and 155a. At this time, the second semiconductor islands 151b are covered with the second photoresist PR2 to be protected from impurity implantation.

Figure 17:
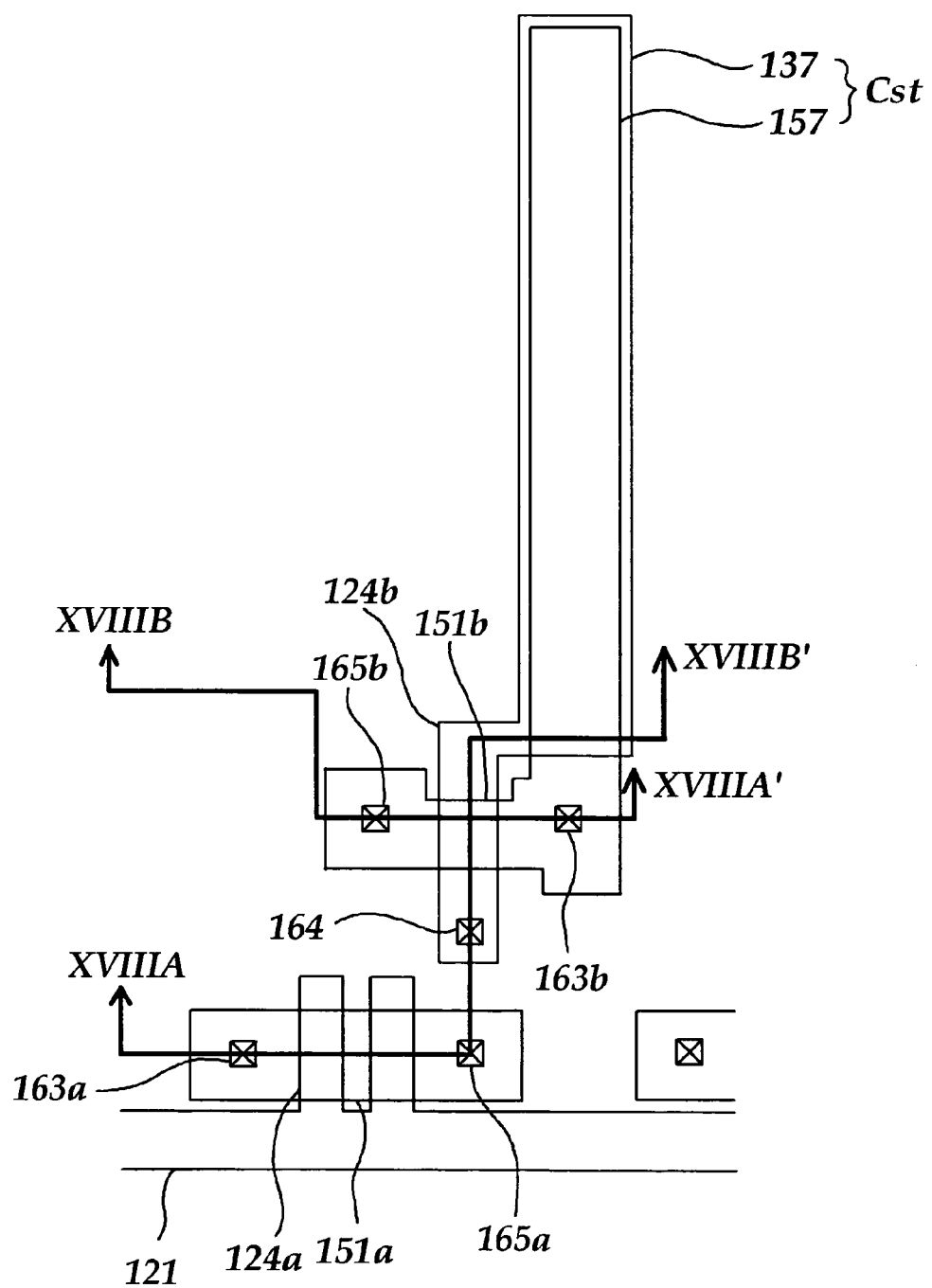
Figure 18A:
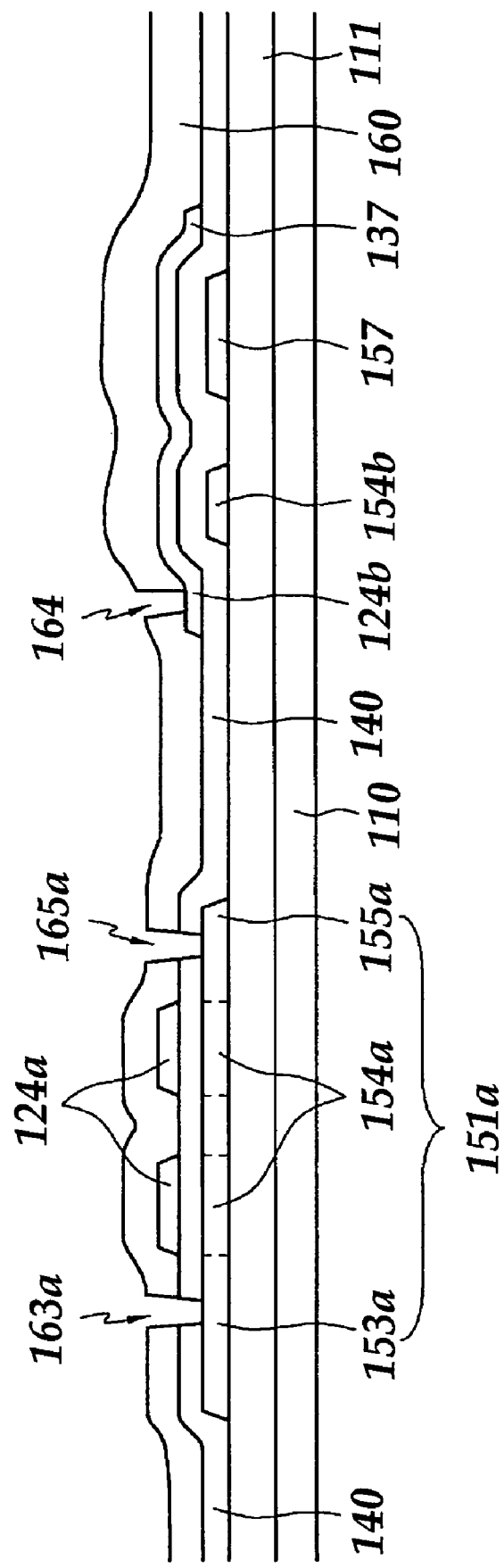
Figure 18B:
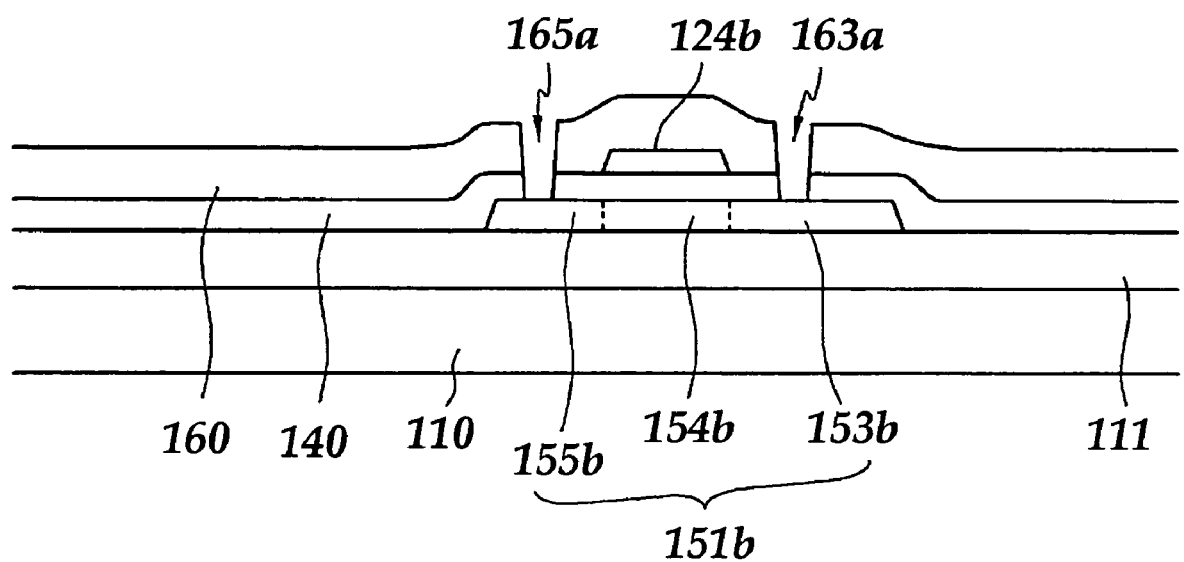

Referring to FIGS. 17–18B, an interlayer insulating film 160 is deposited and the interlayer insulating film 160 and the gate insulating layer 140 are photo-etched form a plurality of contact holes 163a, 163b, 165a and 165b exposing the extrinsic regions 153a, 155a, 153b and 155b, respectively, as well as a plurality of contact holes 164 exposing the gate electrodes 124b.

Figure 19:
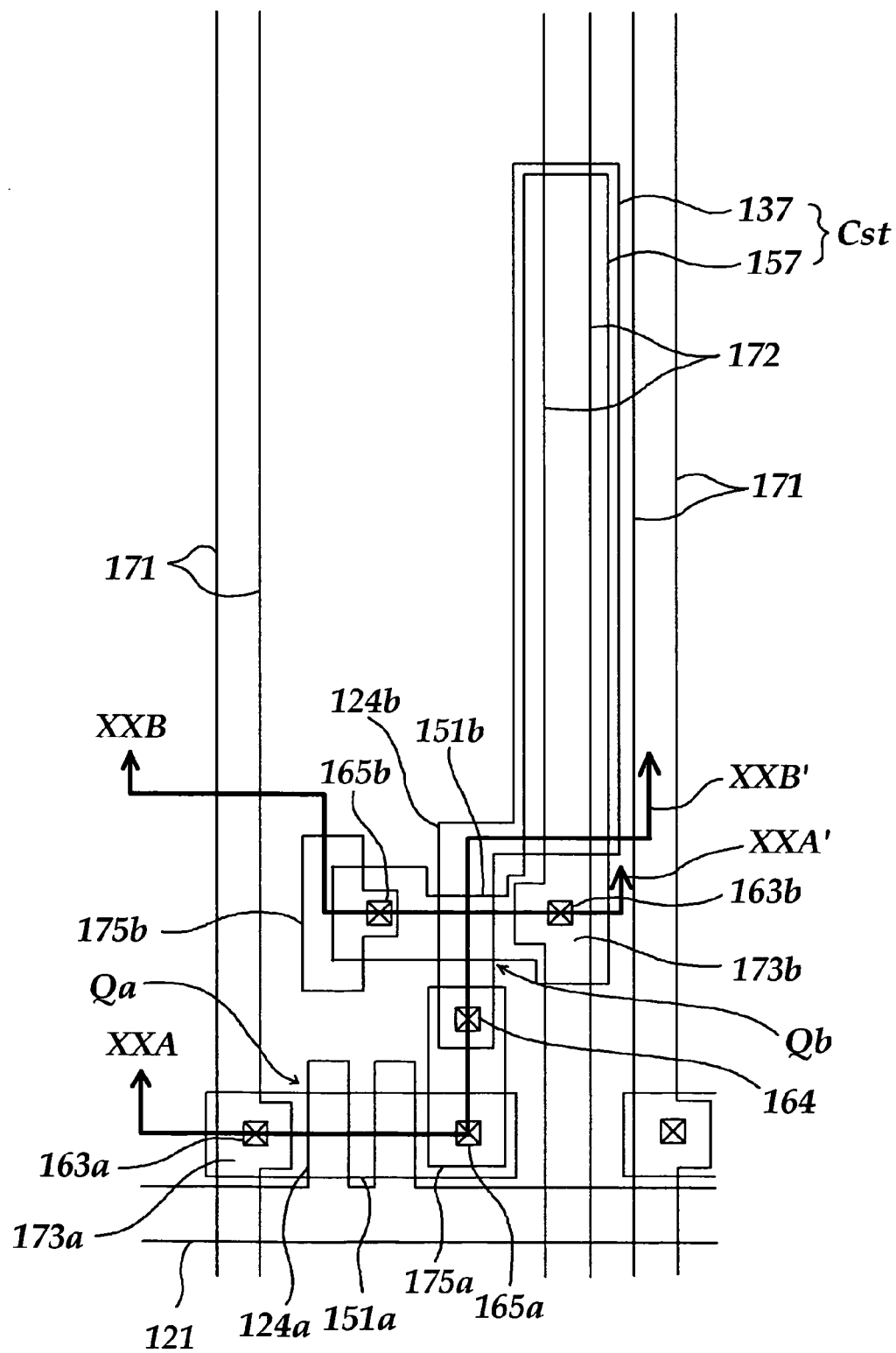
Figure 20A:
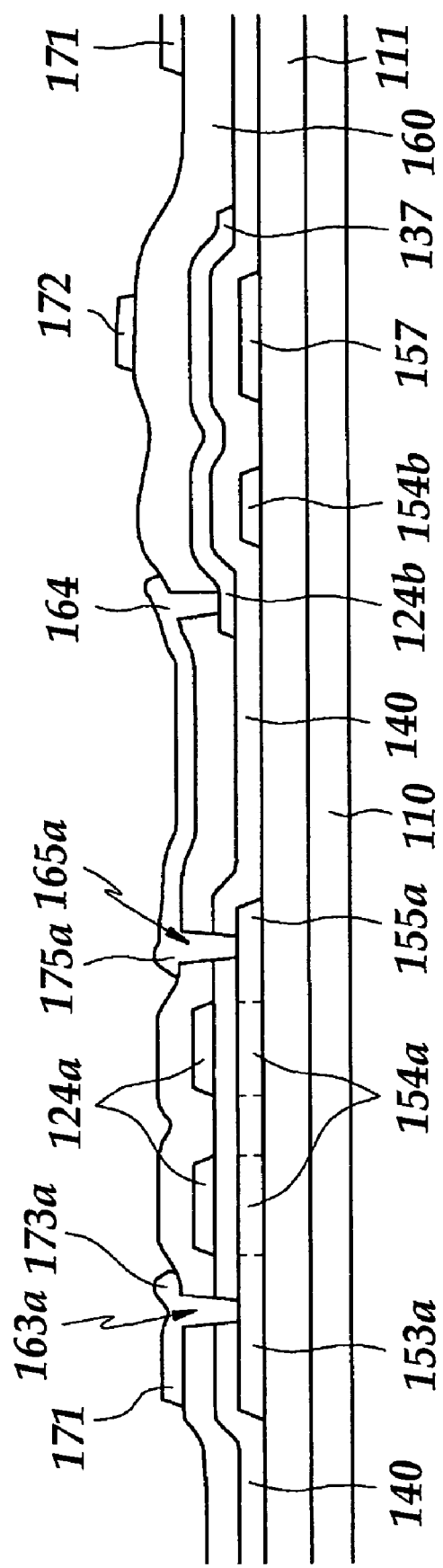
Figure 20B:
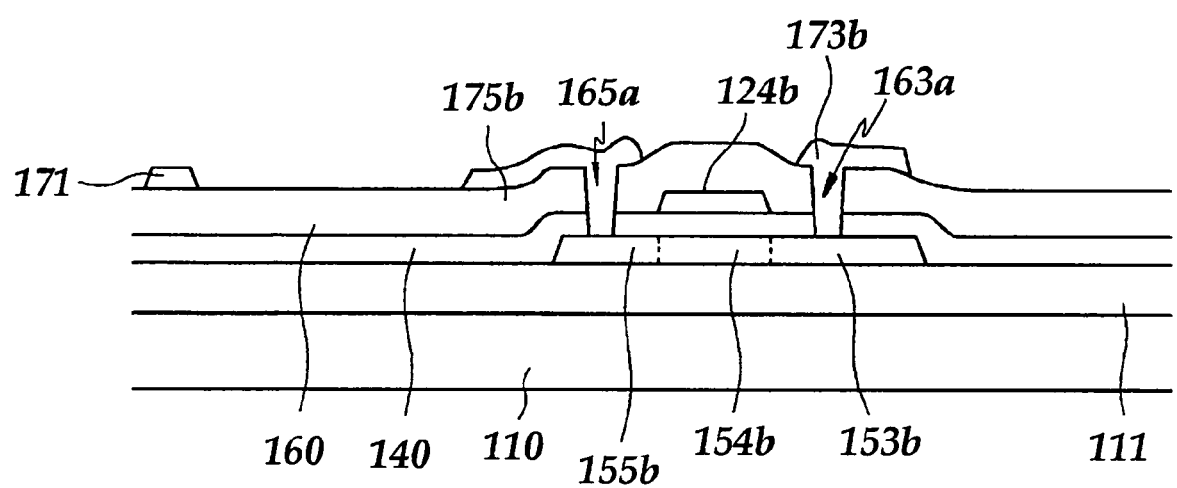

Referring to FIGS. 19–20B, a plurality of data conductors including a plurality of data lines 171 including first source electrodes 173a, a plurality of voltage transmission line 172, a plurality of first and second drain electrodes 175a and 175b are formed on the interlayer insulating layer 160.

Figure 21:
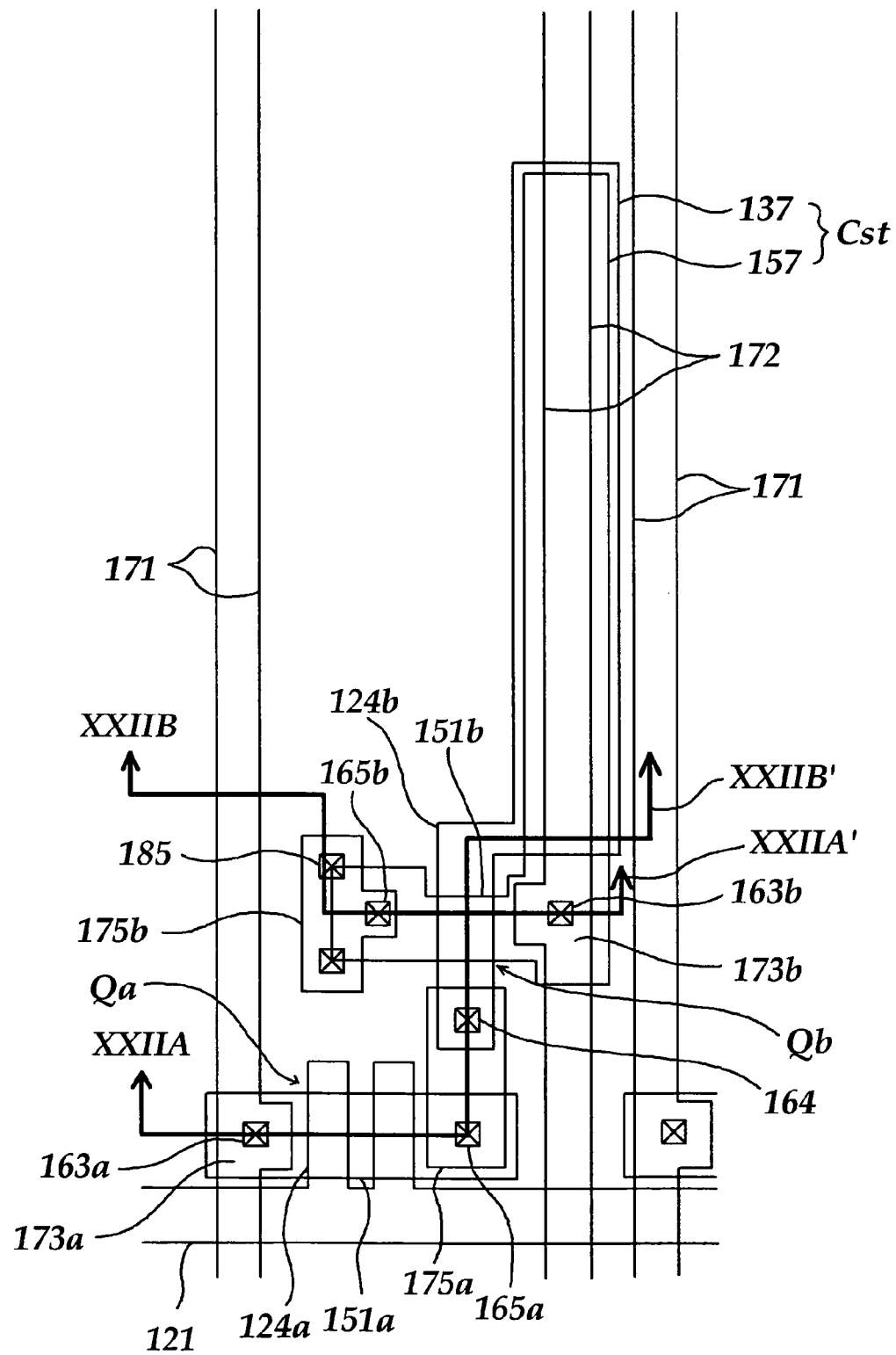
Figure 22A:
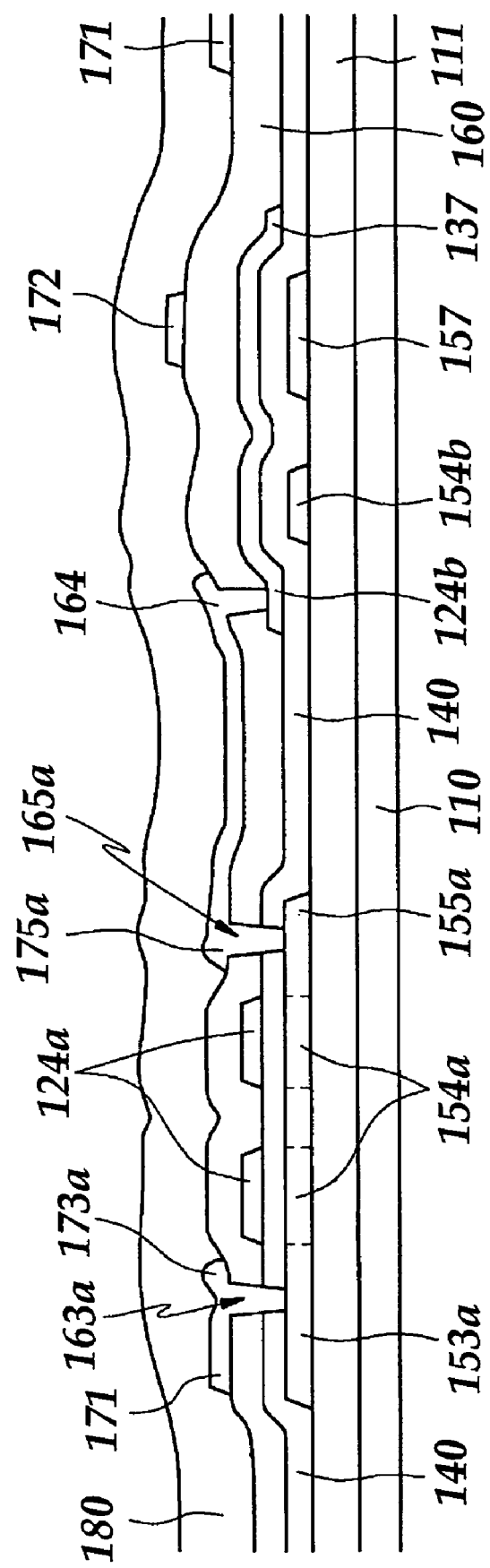
Figure 22B:
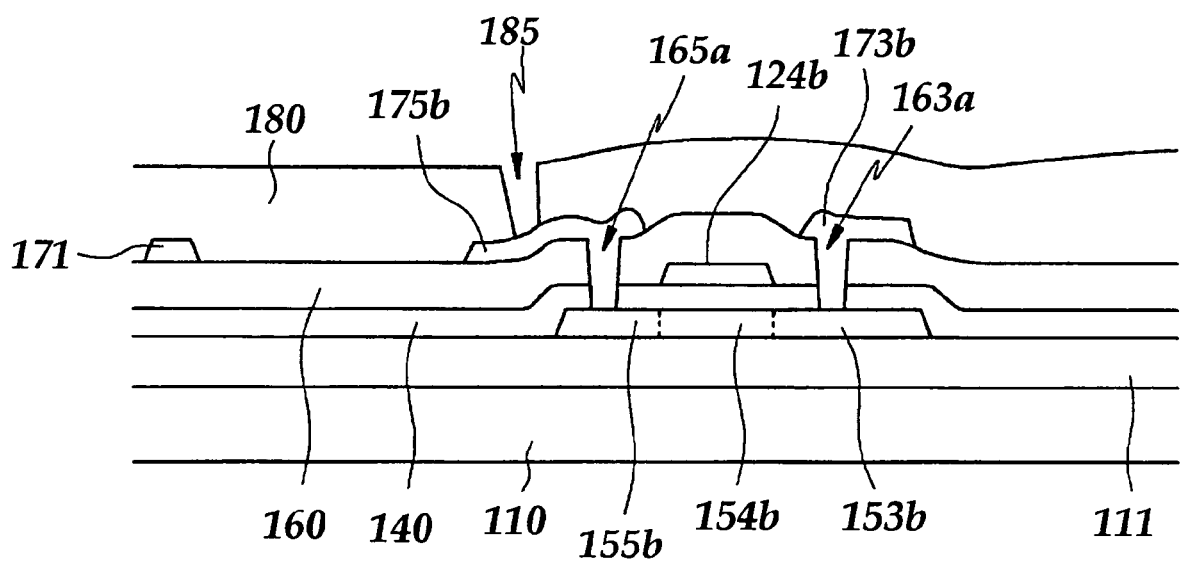

Referring to FIGS. 21–22B, a passivation layer 180 is deposited and is photo-etched to form a plurality of contact holes 185 exposing the second drain electrodes 175b.

Figure 23:
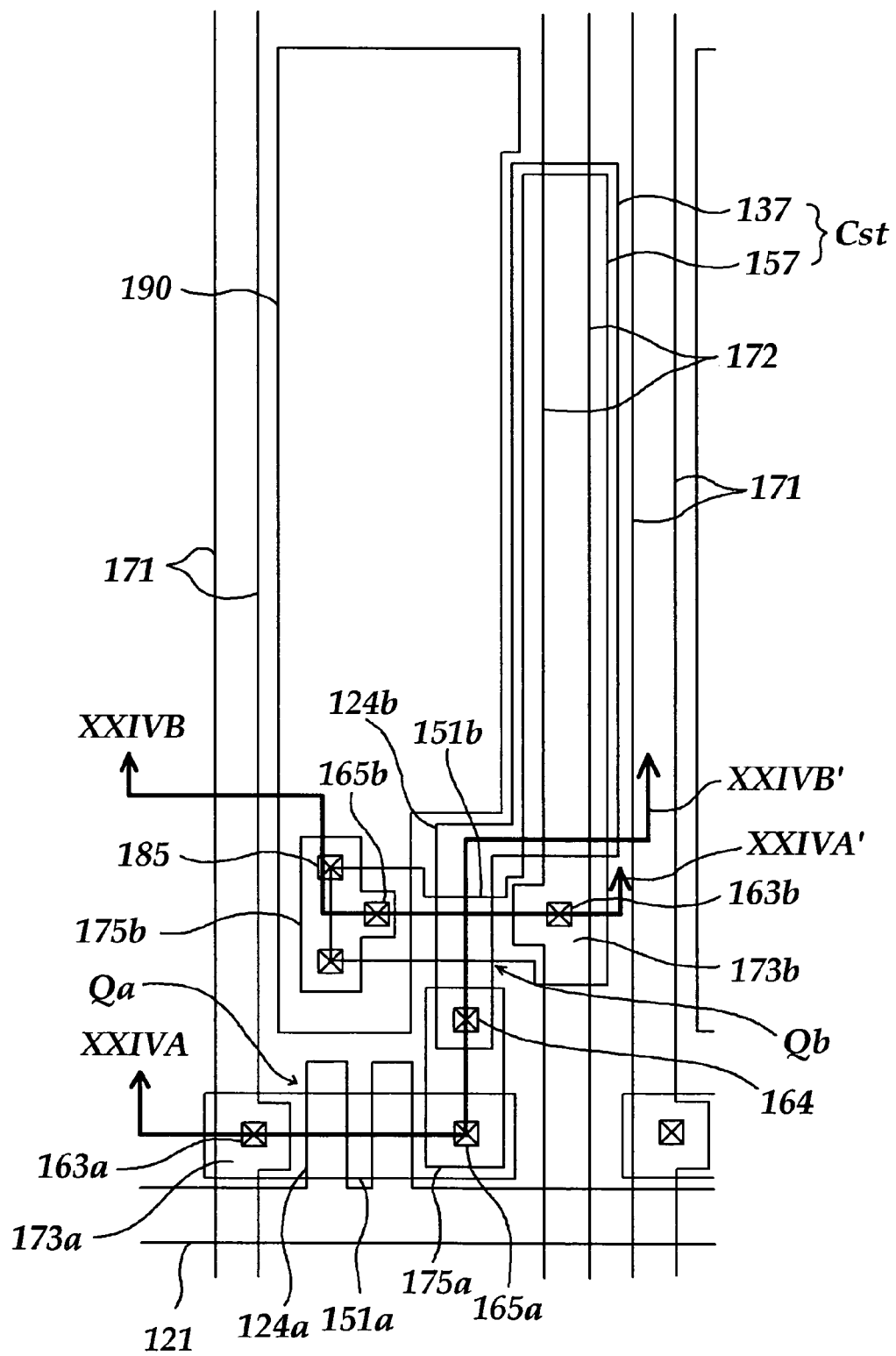
Figure 24A:
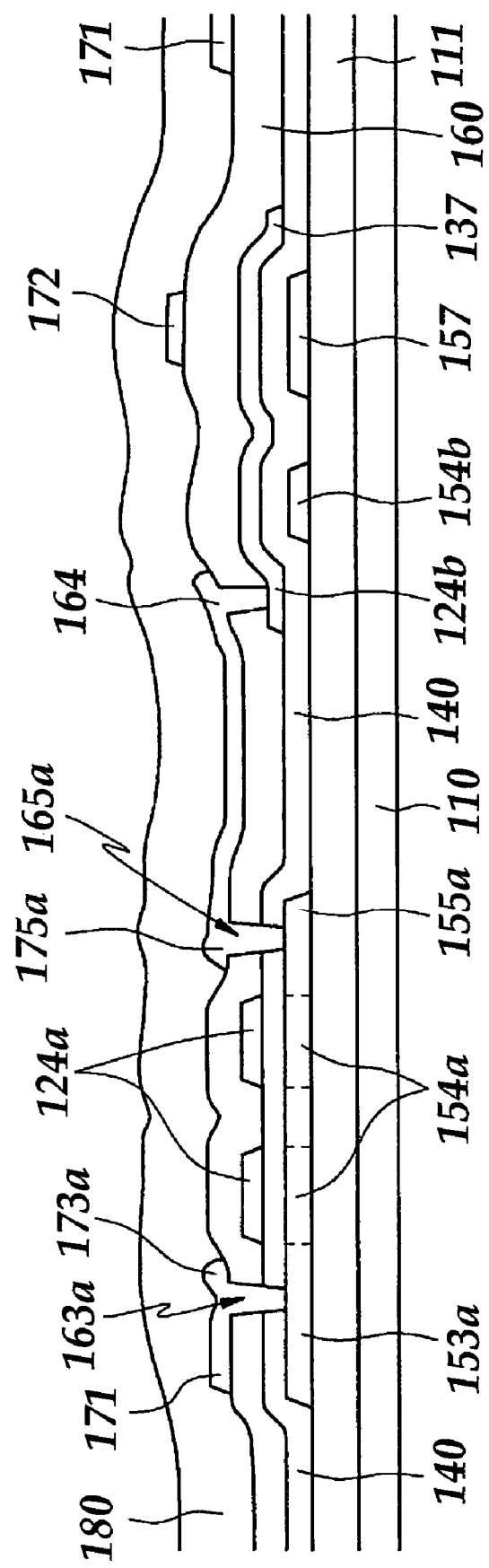
Figure 24B:
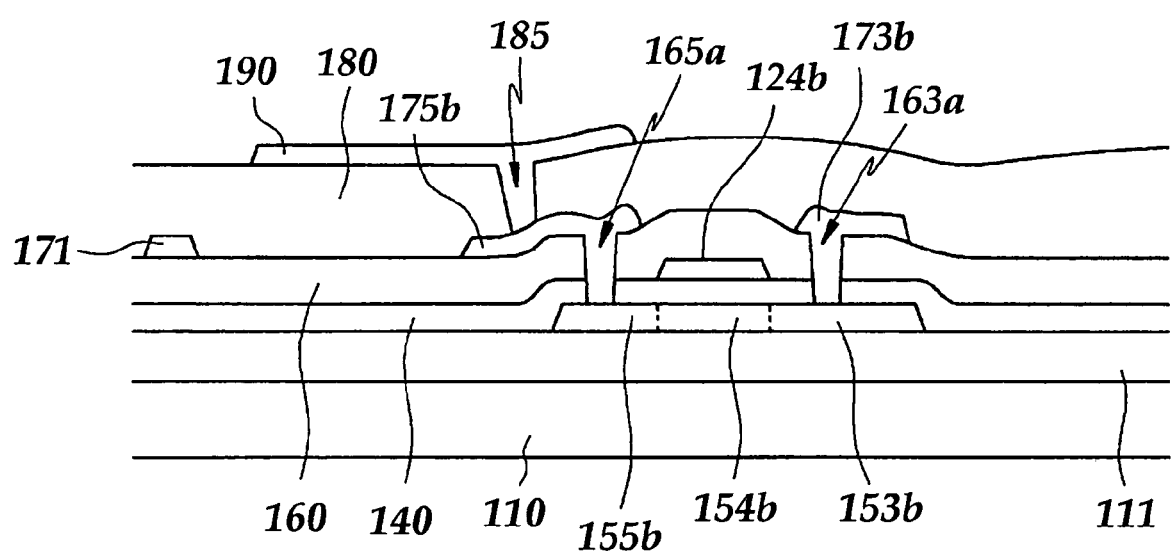

Referring to FIGS. 23–24B, a plurality of pixel electrodes 190 are formed on the passivation layer 180. When the pixel electrodes 190 are made of reflective opaque material, they may be formed of the data metal layer along with the data lines 171.

Referring to FIGS. 8–10, a photosensitive organic film containing black pigment is coated on the pixel electrodes 190 and the passivation layer 180, and it is exposed to light and developed to form a partition 32 defining a plurality of openings on the pixel electrodes 190. Thereafter, a plurality of organic light emitting members 30 are formed in the openings by deposition or inkjet printing following a masking. The organic light emitting member 30 preferably has a multi-layered structure.

Next, a buffer layer 34 and a common electrode 270 are sequentially formed.

An auxiliary electrode (not shown) preferably made of low resistivity material such as Al may be formed before or after the formation of the common electrode 270.

Now, a TFT array panel for an LCD according to an embodiment of the present invention will be described in detail with reference to FIGS. 25 and 26.

Figure 25:
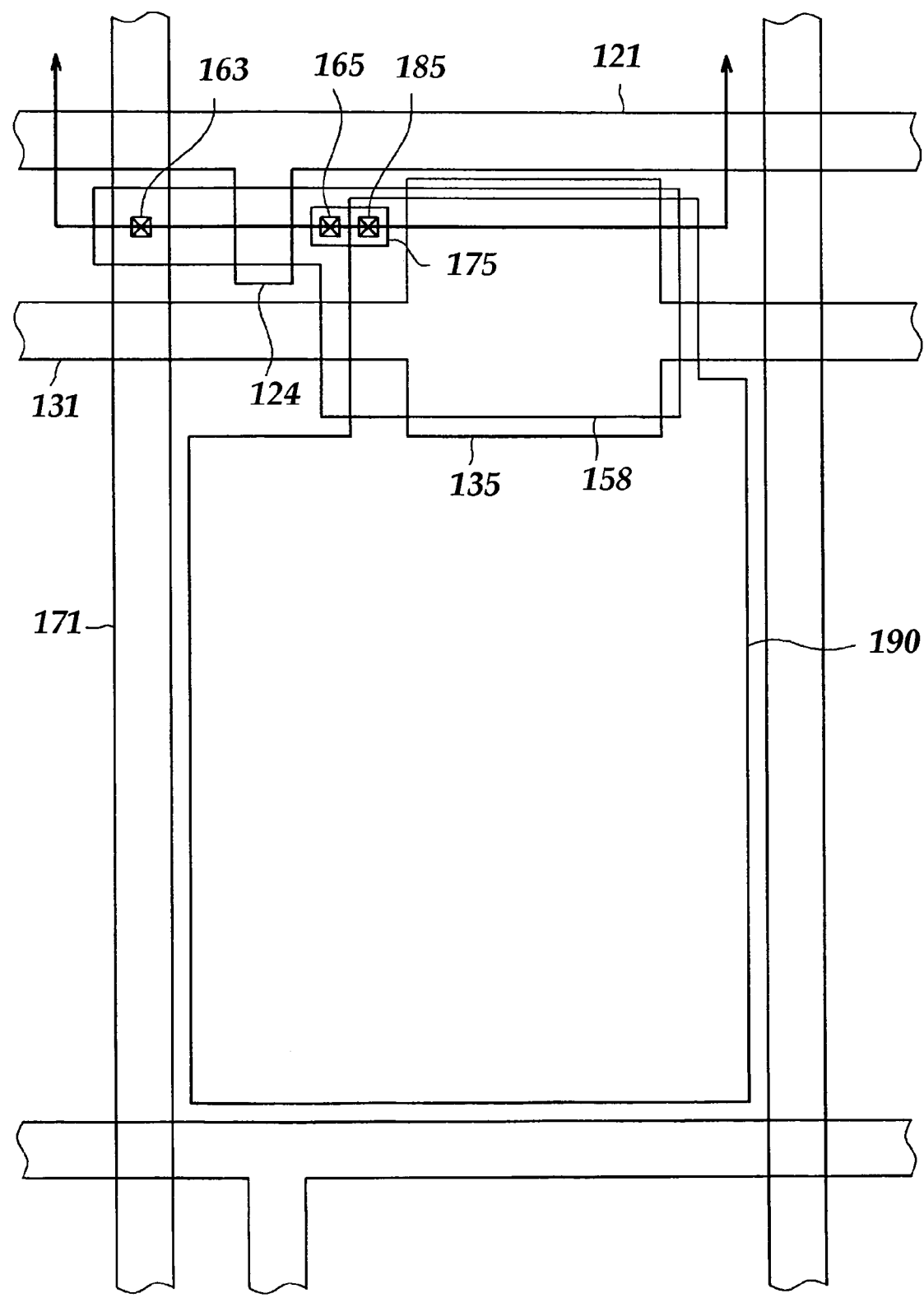
FIG. 25 is a layout view of a TFT array panel according to an embodiment of the present invention.
Figure 26:
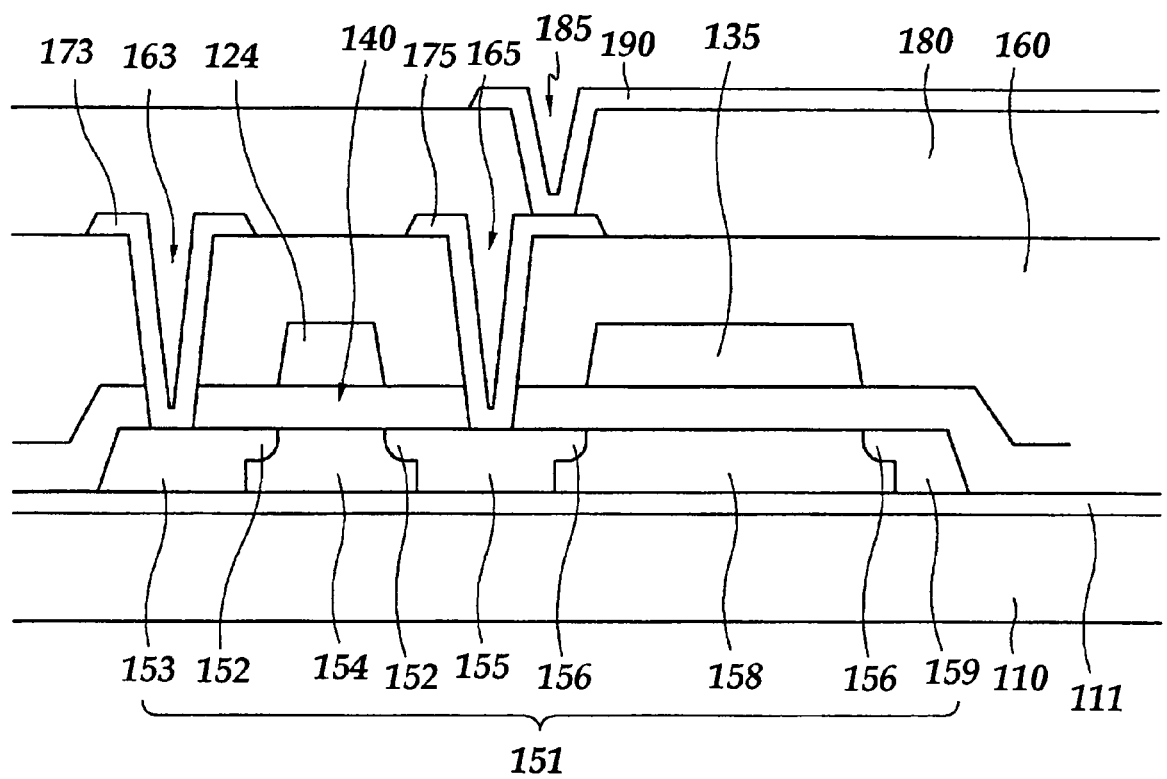
FIG. 26 is a sectional view of the TFT array panel taken along the lines XXVI–XXVI'.

FIG. 25 is a layout view of a TFT array panel according to an embodiment of the present invention and FIG. 26 is a sectional view of the TFT array panel taken along the lines XXVI–XXVI'.

Referring to FIGS. 25 and 26, a layered structure of the TFT array panel according to this embodiment is similar to the TFT array panel for an OLED shown in FIGS. 8–10.

That is, a blocking film 111 is formed on a substrate 110, and a plurality of semiconductor islands 151 are formed thereon. Each of the semiconductor islands 151 include a channel region 154, a storage regions 157, source and drain regions 153 and 155. A gate insulating layer 140 is formed on the semiconductor islands 151 and a plurality of gate lines 121 including gate electrodes 124 are formed thereon. An interlayer insulating layer 160 is formed on the gate lines 121 and a plurality of data lines 171 including source electrodes 173 and a plurality of drain electrodes 175 are formed on the interlayer insulating layer 160. A passivation layer 180 is formed on the data lines 171, the drain electrodes 175 and the interlayer insulating layer 160 and a plurality of pixel electrodes 190 are formed on the passivation layer 180. The interlayer insulating layer 160 has a plurality of contact holes 163 and 165 exposing the source and the drain regions 153 and 155, respectively, and the passivation layer 180 has a plurality of contact holes 185 exposing the drain electrodes 175.

Different from the TFT array panel shown for an OLED in FIGS. 8–10, the TFT array panel for an LCD shown in FIGS. 25 and 26 includes no light emitting members 30, no partition 32, and no buffer layer 34. Instead, an LCD including the TFT array panel may include a liquid crystal layer (not shown) disposed between the pixel electrodes 190 and a common electrode (not shown).

Each pixel of the TFT array panel includes only one TFT connected to a gate line 121, a data line 171, and a pixel electrode 190. Accordingly, there is one semiconductor island 151, one pair of source and drain electrodes 173 and 175, and one pair of contact holes 163 and 165. The drain electrodes 175 are directly connected to the pixel electrodes 190 through the contact holes 185 and there is no contact hole 164.

Each semiconductor island 151 further include a storage region 158 without impurity and dummy regions 159 containing impurity like the source and the drain regions 153 and 155. The semiconductor island 151 further includes lightly doped regions 152 and 156 disposed between intrinsic regions 151 and 158 and extrinsic regions 153, 155 and 159 and having impurity concentration lower than the source and the drain regions 153 and 155.

In addition, the TFT array panel further includes a plurality of storage electrode lines 131 preferably made of the same layer as the gate lines 121 and extending substantially parallel to the gate lines 121. The storage electrode lines 131 include storage electrodes 135 overlapping the storage regions 158.

The pixel electrodes 190 supplied with data signals generate electric fields in cooperation with the common electrode, which determine orientations of liquid crystal molecules in the liquid crystal layer disposed therebetween. A pixel electrode 190 and a common electrode form a liquid crystal capacitor and a pixel electrode 190 and a drain region 155 connected thereto and a storage electrode line 131 including the storage electrodes 137 form a storage capacitor.

Many of the above-described features of the TFT array panel shown in FIGS. 8–24 may be appropriate to the TFT array panel shown in FIGS. 25 and 26.

In particular, the semiconductor islands 151 of the TFT array panel can be formed by SLS with masks shown in FIGS. 5 and 7.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A crystallization mask for laser illumination to convert amorphous silicon into polysilicon, the mask comprising:
   a plurality of transmissive areas including a plurality of first slits having a first width and configured to adjust energy of the laser illumination passing through the mask, the plurality of transmissive areas further including a plurality of second slits having a second width different than the first width; and
   an opaque area blocking the laser illumination and separating the first slits from the second slits.

2. The mask of claim 1, wherein the plurality of second slits are configured to substantially fully transmit the laser illumination.

3. The mask of claim 2, wherein the plurality of first slits include translucent films and the plurality of second slits are openings.

4. The mask of claim 3, wherein the first width is less than the second width of the second slits.

5. The mask of claim 3, wherein the plurality of second slits are arranged in a plurality of slit columns, wherein a pitch of the plurality of second slits is a distance between centers of adjacent second slits in a slit column, and wherein the second slits in adjacent slit columns are offset by a half of the pitch.

* * * * *